(12) United States Patent
Kim et al.

(10) Patent No.: US 10,539,842 B2
(45) Date of Patent: Jan. 21, 2020

(54) PRINTED CIRCUIT BOARD PACKAGE AND DISPLAY DEVICE INCLUDING THE SAME

(71) Applicant: SAMSUNG DISPLAY CO., LTD., Yongin-si, Gyeonggi-Do (KR)

(72) Inventors: Byoung Yong Kim, Seoul (KR); Jong Hyuk Lee, Seoul (KR); Jeong Ho Hwang, Cheonan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 204 days.

(21) Appl. No.: 15/636,797

(22) Filed: Jun. 29, 2017

(65) Prior Publication Data

US 2018/0004031 A1    Jan. 4, 2018

(30) Foreign Application Priority Data

Jul. 4, 2016    (KR) .................. 10-2016-0084392

(51) Int. Cl.
  *G02F 1/1345* (2006.01)
  *G09G 3/00* (2006.01)
  (Continued)

(52) U.S. Cl.
  CPC .......... *G02F 1/13452* (2013.01); *C23C 18/28* (2013.01); *G02F 1/1309* (2013.01);
  (Continued)

(58) Field of Classification Search
  CPC ............. G02F 1/13452; G02F 1/13458; G02F 1/1309; H05K 1/0268; H05K 1/111;
  (Continued)

(56) References Cited

U.S. PATENT DOCUMENTS

2006/0284821 A1* 12/2006 Takenaka ............... G09G 3/006
                                                          345/100
2007/0109485 A1*  5/2007 Eguchi .................. G02F 1/1309
                                                          349/151
(Continued)

FOREIGN PATENT DOCUMENTS

| JP | 2010-118428 | 5/2010 |
| KR | 10-2011-0004117 | 1/2011 |
| KR | 10-2013-0081506 | 7/2013 |

*Primary Examiner* — William H. Mayo, III
*Assistant Examiner* — Rhadames Alonzo Miller
(74) *Attorney, Agent, or Firm* — F. Chau & Associates, LLC

(57) ABSTRACT

A display device includes a display substrate including a display area and a pad region, a first pad portion including a plurality of first pad terminals, the plurality of first pad terminals being arranged in a first direction, and a printed circuit board (PCB) including a base film and a second pad portion. The second pad is electrically connected to the first pad portion. The second pad portion includes a plurality of second pad terminals electrically connected to the plurality of first pad terminals, and a plurality of first test lines. The plurality of second pad terminals includes a plurality of sub-pad terminals. One of the plurality of first lines is connected to a first sub-pad terminal of the plurality of sub-pad terminals, and a second sub-pad terminal of the plurality of sub-pad terminals is not connected to any of the plurality of first lines.

18 Claims, 20 Drawing Sheets

(51) Int. Cl.
*G02F 1/13* (2006.01)
*C23C 18/28* (2006.01)
*H01L 23/00* (2006.01)
*H05K 1/05* (2006.01)
*H05K 3/18* (2006.01)
*H05K 3/20* (2006.01)
*H05K 3/32* (2006.01)
*H05K 3/38* (2006.01)

(52) U.S. Cl.
CPC ............ *G09G 3/006* (2013.01); *H01L 24/27* (2013.01); *H05K 1/056* (2013.01); *H05K 3/181* (2013.01); *H05K 3/205* (2013.01); *H05K 3/323* (2013.01); *H05K 3/385* (2013.01); *H05K 3/386* (2013.01); *G09G 2330/12* (2013.01)

(58) Field of Classification Search
CPC .......... H05K 2201/09409; H05K 2201/10128; G09G 3/006; G09G 2330/12
See application file for complete search history.

(56) References Cited

U.S. PATENT DOCUMENTS

| | | | |
|---|---|---|---|
| 2008/0030668 A1* | 2/2008 | Komaju | G02F 1/1345 349/151 |
| 2008/0204618 A1* | 8/2008 | Jung | G02F 1/13452 349/40 |
| 2010/0201661 A1* | 8/2010 | Kimura | G02F 1/13452 345/205 |
| 2012/0061669 A1* | 3/2012 | Kim | H01L 22/00 257/48 |
| 2014/0319523 A1* | 10/2014 | Lee | H01L 22/34 257/48 |
| 2014/0347593 A1* | 11/2014 | Han | G02F 1/1309 349/54 |
| 2015/0371977 A1 | 12/2015 | Huang | |
| 2016/0055777 A1 | 2/2016 | Kim | |
| 2016/0066409 A1 | 3/2016 | Kwon et al. | |
| 2016/0357050 A1* | 12/2016 | Han | G02F 1/1309 |
| 2018/0020550 A1* | 1/2018 | Jang | H05K 1/028 |

* cited by examiner

PRINTED CIRCUIT BOARD PACKAGE AND DISPLAY DEVICE INCLUDING THE SAME

CROSS-REFERENCE TO RELATED APPLICATION

This application claims priority under 35 U.S.C. § 119 to Korean Patent Application No. 10-2016-0084392, filed in the Korean Intellectual Property Office on Jul. 4, 2016, the disclosure of which is incorporated by reference herein in its entirety.

TECHNICAL FIELD

The present invention relates to a display device, and more particularly, to a display device including a printed circuit board (PCB) package.

DISCUSSION OF THE RELATED ART

A display device may be a liquid crystal display (LCD) device, a plasma display panel (PDP) device, an organic light emitting diode (OLED) device, a field effect display (FED) device, an electrophoretic display device, or the like.

An OLED device may include include two electrodes and an organic emission layer positioned between the two electrodes. An electron injected from one electrode and a hole injected from the other electrode may be coupled with each other in the organic emission layer to generate an exciton, and the exciton emits energy in the form of light.

Since the OLED device has a self-luminance characteristic and does not require a separate light source, the OLED display may be thin and light.

To drive an organic light emitting element of the OLED device, a printed circuit board (PCB) may be used to transmit driving signals to the OLED device. The PCB may include a plurality of pads through which the driving signals may be transmitted. The pads of the PCB may be aligned with pads of the display panel of the OLED device.

SUMMARY

The present invention relates to a display device having a printed circuit board (PCB), the PCB being more easily tested by using a probe.

The present invention relates to a PCB package for manufacturing a small test pad portion and performing a test by having a probe contacting a pad terminal.

According to an exemplary embodiment of the present invention, a display device includes a display substrate including a display area for displaying an image and a pad region disposed at a side of the display area, a first pad portion including a plurality of first pad terminals, the first pad portion being disposed in the pad region, the plurality of first pad terminals being arranged in a first direction, and a printed circuit board (PCB) including a base film and a second pad portion. The second pad portion is disposed at a side of the base film and is electrically connected to the first pad portion. The second pad portion includes a plurality of second pad terminals electrically connected to the plurality of first pad terminals, and a plurality of first test lines. The plurality of second pad terminals includes a plurality of sub-pad terminals. One of the plurality of first lines is connected to a first sub-pad terminal of the plurality of sub-pad terminals, and a second sub-pad terminal of the plurality of sub-pad terminals is not connected to any of the plurality of first lines, and each of the plurality of first lines extends toward an end portion of the base film.

According to an exemplary embodiment of the present invention, a PCB package includes a base film, a first test pad portion electrically connected to a plurality of second pad terminals, and a second pad portion disposed on a first side of the base film, the second pad portion including the plurality of second pad terminals. The plurality of second pad terminals is arranged along a first direction. The plurality of second pad terminals includes a plurality of first sub-pad terminals. The first test pad portion is electrically connected to a first sub-pad terminal of the plurality of first sub-pad terminals, and a second sub-pad terminal of the plurality of first sub-pad terminals is not electrically connected to the first test pad portion.

BRIEF DESCRIPTION OF THE DRAWINGS

The above and other features of the present invention will become more clearly understood by describing in detail exemplary embodiments thereof in conjunction with the accompanying drawings, in which.

DETAILED DESCRIPTION OF THE EMBODIMENTS

Figure 1:
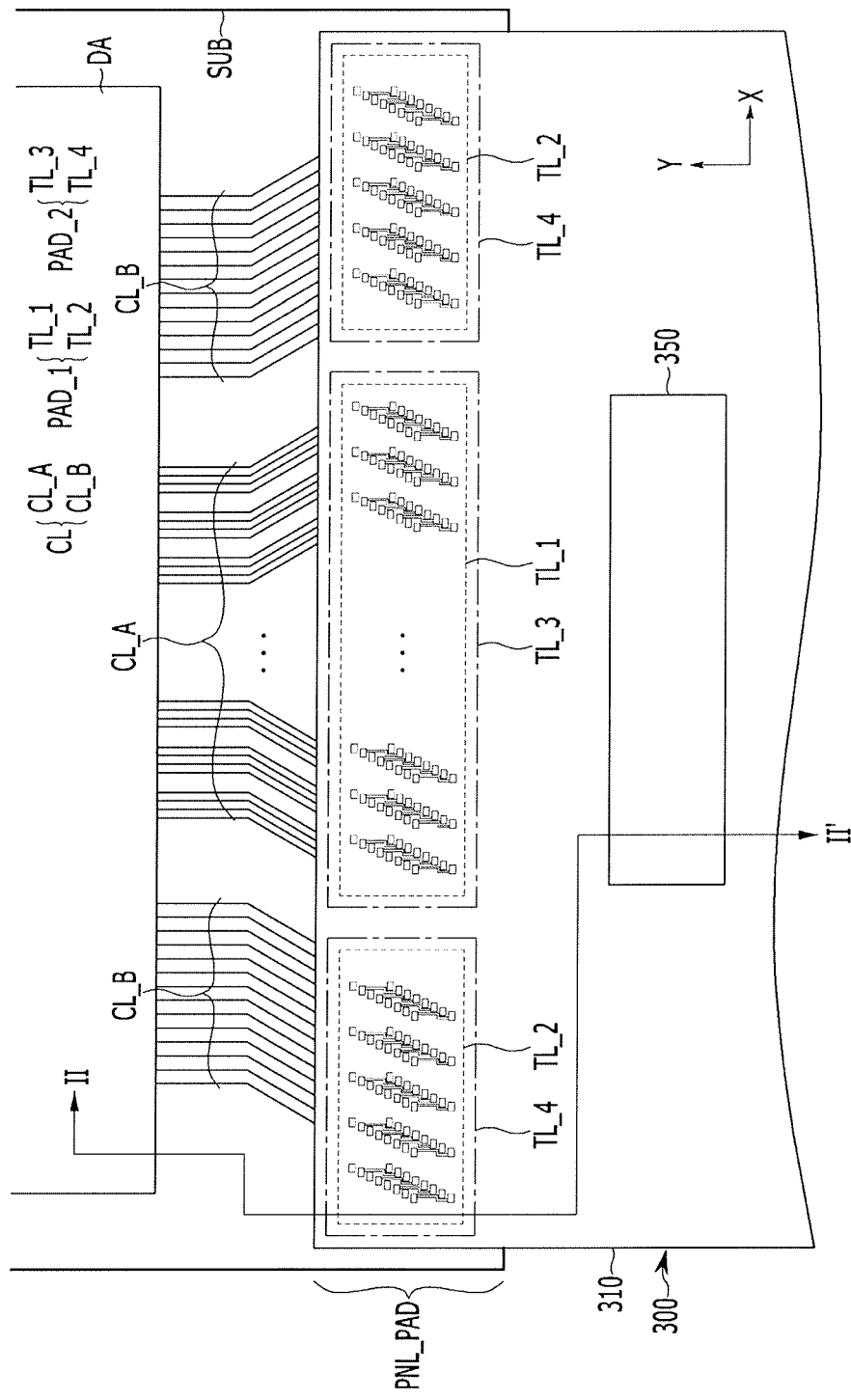
FIG. 1 is a plan view illustrating a display device according to an exemplary embodiment of the present invention.

The present invention will be described more fully hereinafter with reference to the accompanying drawings. The disclosed embodiments may be modified in various different ways without departing from the spirit and scope of the present invention. Like reference numerals may refer to like elements throughout the specification.

The size and thickness of each component shown in the drawings may be exaggerated for clarity.

It will be understood that when an element such as a layer, film, region, or substrate is referred to as being "on" another element, it can be directly on the other element or intervening elements may also be present therebetween.

A display device, according to an exemplary embodiment of the present invention, will now be described with reference to FIG. 1 and FIG. 2.

FIG. 1 is a plan view illustrating a display device according to an exemplary embodiment of the present invention. FIG. 2 is a cross-sectional view taken along line II-II' of FIG. 1, according to an exemplary embodiment of the present invention.

Figure 2:
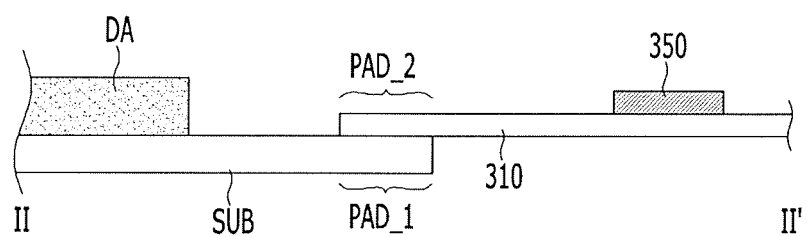
FIG. 2 is a cross-sectional view taken along line II-II' of FIG. 1, according to an exemplary embodiment of the present invention.

Referring to FIG. 1 and FIG. 2, a display device, according to an exemplary embodiment of the present invention, may include a display substrate (SUB), a first pad portion (PAD_1), a second pad portion (PAD_2), and a printed circuit board (PCB) 300. A plurality of third-row sub-pad terminals (ROW_PAD_C, refer to FIG. 7) are generated on the second pad portion (PAD_2) of the printed circuit board (PCB) 300. First test lines (TEST_LN, refer to FIG. 7) for testing the printed circuit board (PCB) 300 may be connected to some of the third-row sub-pad terminals (ROW_PAD_C, refer to FIG. 7). In this case, the first test lines (TEST_LN, refer to FIG. 7) may be connected to first test pad terminals (TEST_PAD_A, refer to FIG. 7) before the printed circuit board (PCB) 300 is attached to a display substrate (SUB).

Referring to FIG. 1 and FIG. 2, the display device may include a display area (DA) and a pad region (PNL_PAD). The display area (DA) and the pad region (PNL_PAD) represent areas of the display substrate (SUB).

The display area (DA) is a region of the display substrate (SUB) for displaying an image, and a display panel (100, refer to FIG. 3), for emitting light, may be provided on the display area (DA).

The pad region (PNL_PAD) represents a region provided around the display area (DA) or at a side of the display area (DA). A printed circuit board (PCB) 300 for transmitting a signal for driving the display panel (100) may be electrically connected to the pad region (PNL_PAD). The first pad portion (PAD_1) may be disposed in the pad region (PNL_PAD) of the display substrate (SUB), and the first pad portion (PAD_1) may be electrically connected to the printed circuit board (PCB) 300.

The first pad portion (PAD_1) may include a first terminal region (TL_1) and a second terminal region (TL_2). The first terminal region (TL_1) and the second terminal region (TL_2) represent regions provided on the display substrate (SUB). A plurality of first pad terminals (PAD_TL_A, refer to FIG. 5) may be disposed in the first terminal region (TL_1) and the second terminal region (TL_2).

The first terminal region (TL_1) may be connected to data wires of the display area (DA) through a plurality of first connection lines (CL_A). A plurality of first pad terminals (PAD_TL_A, refer to FIG. 5) may be respectively separated from each other at regular intervals and may be disposed in a first direction in the first terminal region (TL_1). An X axis may represent a first direction, and a Y axis may represent a second direction.

The second terminal region (TL_2) may be connected to power cables such as a driving power line, a common power line, an initialization power line, and a scan line through a plurality of second connection lines (CL_B). The power cables are disposed in the display area (DA). A plurality of first pad terminals (PAD_TL_A, refer to FIG. 5) may be separated from each other at regular intervals and may be disposed in the first direction (X axis) in the second terminal region (TL_2).

The first terminal region (TL_1) and the second terminal region (TL_2 included in the pad region (PNL_PAD), may be disposed in parallel in the first direction (X axis). The pad region (PNL_PAD) may be separated from the display area (DA) and may be disposed in the second direction (Y axis).

In an exemplary embodiment of the present invention, as shown in FIG. 1, the second terminal region (TL_2) may be provided on opposing sides of the first terminal region (TL_1). However, the present invention is not limited thereto, and the second terminal region (TL_2) may be provided between a pair of first terminal regions (TL_1). A detailed configuration of a plurality of first pad terminals (PAD_TL_A, refer to FIG. 5), disposed in the first terminal region (TL_1) and the second terminal region (TL_2), will be described below.

A connection line (CL) may be provided between the display area (DA) and the pad region (PNL_PAD). The display area (DA) may be connected to the pad region (PNL_PAD) through the connection line (CL). The connection line (CL) may be connected to a plurality of signal lines disposed in the display area (DA). Further, the connection line (CL) may be connected to a first pad terminals (PAD_TL_A) of the pad region (PNL_PAD).

The connection line (CL) may include a first connection line (CL_A) and a second connection line (CL_B). The first connection line (CL_A) may electrically connect the display area (DA) with the first terminal region (TL_1). The second connection line (CL_B) may electrically connect the display area (DA) with the second terminal region (TL_2).

The printed circuit board (PCB) 300 may be electrically connected to the first pad portion (PAD_1) of the pad region (PNL_PAD) of the display substrate (SUB) to transmit a signal for driving the display panel (100, refer to FIG. 3) to the display panel 100. A driving chip 350 may be installed in a base film 310 of the printed circuit board (PCB) 300, and the driving chip 350 may be used to drive the display panel 100.

The second pad portion (PAD_2) may be disposed along an edge of the base film 310 of the printed circuit board (PCB) 300. The second pad portion (PAD_2) may be electrically connected to the first pad portion (PAD_1) of the display substrate (SUB). The second pad portion (PAD_2) may be disposed to face the first pad portion (PAD_1).

The second pad portion (PAD_2) may include a third terminal region (TL_3) and a fourth terminal region (TL_4). The third terminal region (TL_3) and the fourth terminal region (TL_4) may be regions of the base film 310.

plurality of second pad terminals (PAD_TL_B, refer to FIG. 7) may be disposed in the third terminal region (TL_3) and the fourth terminal region (TL_4). The second pad terminals (PAD_TL_B, refer to FIG. 7) may be arranged to correspond or overlap the first pad terminals (PAD_TL_A, refer to FIG. 5).

For example, according to an exemplary embodiment of the present invention, the second pad portion (PAD_2) of the printed circuit board (PCB) 300 may have a shape corresponding to the shape of first pad portion (PAD_1) of the display substrate (SUB). In addition, a plurality of pad terminals disposed on the second pad portion (PAD_2) may be arranged with a same or similar pattern as a pattern of arrangement of a plurality of pad terminals of the first pad portion (PAD_1). A detailed configuration of the second pad terminals (PAD_TL_B, refer to FIG. 7) will be described below.

An example of the display panel 100 provided in the display area (DA) will now be described with reference to FIG. 3 and FIG. 4.

Figure 3:
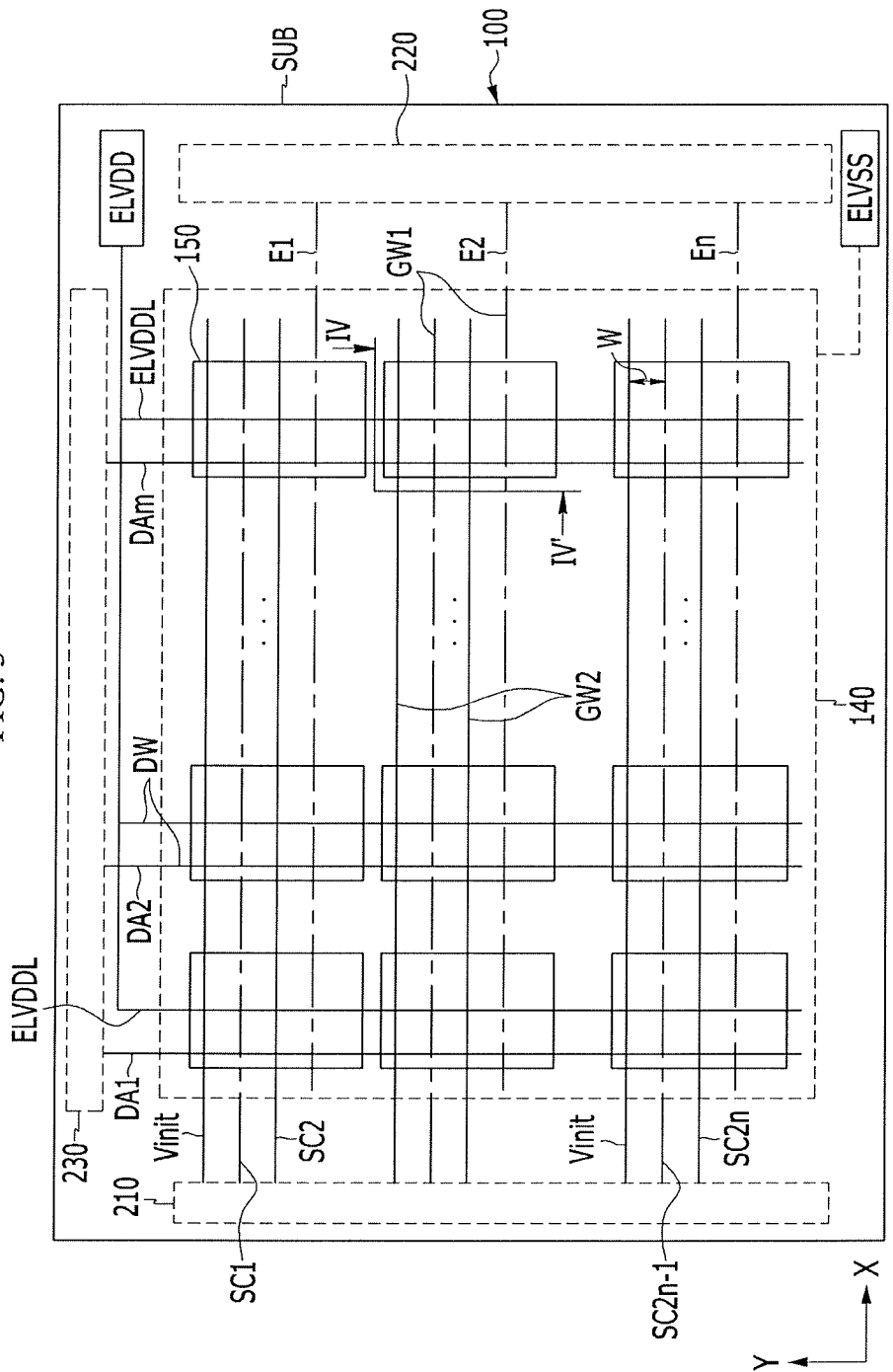
FIG. 3 is a plan view illustrating a display area of FIG. 1 according to an exemplary embodiment of the present invention.
Figure 4:
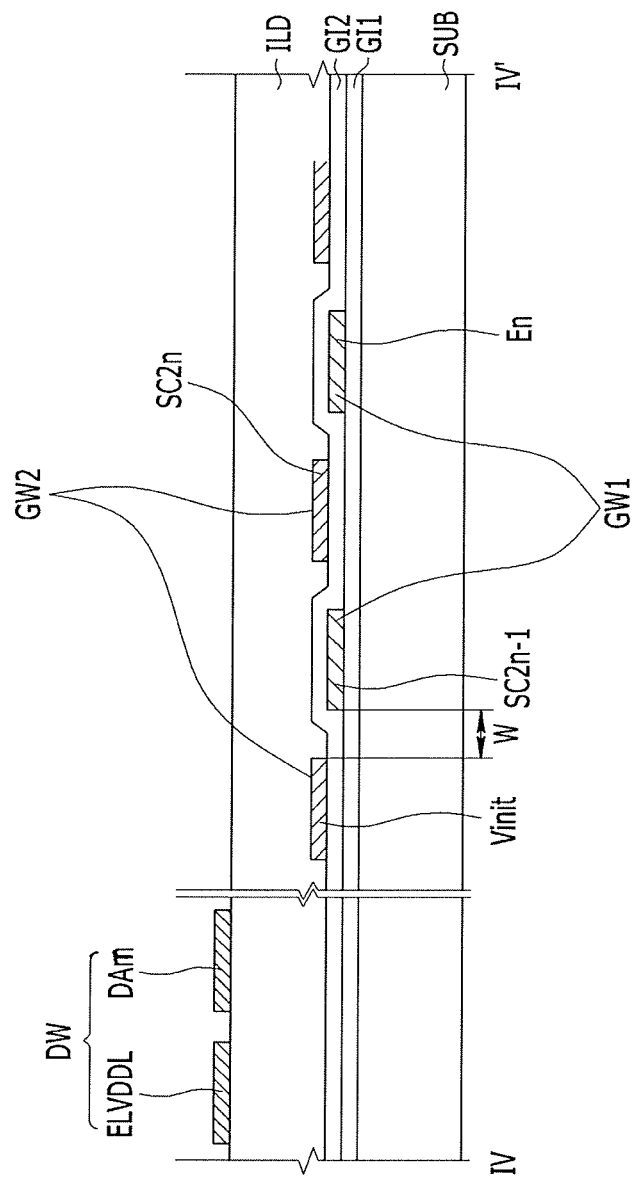
FIG. 4 is a cross-sectional view taken along line IV-IV' of FIG. 3, according to an exemplary embodiment of the present invention.

FIG. 3 is a plan view illustrating a display area (DA) of FIG. 1 according to an exemplary embodiment of the present invention. FIG. 4 is a cross-sectional view taken along line IV-IV' of FIG. 3, according to an exemplary embodiment of the present invention.

The display panel 100 includes first gate wires (GW1), second gate wires (GW2), data wires (DW), a display unit 140, and a pixel 150.

Based on a control signal supplied by an external control circuit (e.g., a timing controller), the gate driver 210 sequentially supplies scan signals to first scan lines (SC2-SC2n) or second scan lines (SC1-SC2n-1) included in the first gate wires GW1 or the second gate wires GW2. In this case, n is an integer that is equal to or greater than 1.

The pixel 150 is selected by the scan signal and subsequently receives a data signal. A gate driver 210 may be included in the driving chip 350, the driving chip 350 being disposed on the printed circuit board (PCB) 300. However, the gate driver 210 may also be included in the substrate (SUB), as shown in FIG. 3.

The first gate wires GW1 are provided on the display substrate (SUB), with a first insulating layer GI1 disposed between the substrate (SUB) and the first gate wires GW1. The first gate wires GW1 are extended in a first direction (X axis). The first gate wires GW1 include a second scan line (SC2n-1) and emission control lines (E1-En).

The second scan line (SC2n-1) is connected to the gate driver 210 and receives a scan-signal from the gate driver 210. The emission control line (En) is connected to an emission control driver 220 and receives an emission control signal from the emission control driver 220. The emission control driver 220 may be included in the driving chip 350. However, the emission control driver 220 may also be included in the substrate (SUB), as shown in FIG. 3.

The second gate wires GW2 are provided on the first gate wires GW1, with a second insulating layer GI2 disposed between the second gate wires GW2 and the first gate wires GW1. The second gate wires GW2 are extended in the first direction (X axis). The second gate wires GW2 include the first scan line (SC2n) and an initialization power line (Vinit).

The first gate wires GW1 do not overlap the second gate wires GW2.

The first scan line (SC2n) is connected to the gate driver 210 and receives a scan signal from the gate driver 210. The initialization power line (Vinit) is connected to the gate driver 210 and receives an initialization power from the gate driver 210.

The initialization power line (Vinit) receives the initialization power from the gate driver 210 in an exemplary embodiment of the present invention. However, the initialization power line (Vinit) may also be connected to another circuit and may receive the initialization power from the other circuit.

The emission control driver 220 sequentially supplies an emission control signal to the emission control line (En). The emission control signal corresponds to a control signal supplied by an external circuit such as a timing controller. The emission control signal controls the emission of the pixel 150.

For example, the emission control signal controls an emission time of the pixel 150. The emission control driver 220 may be omitted depending on a configuration of the pixel 150.

A data driver 230 supplies a data signal to a data line (DAm), from among the data wires (DW). The data signal corresponds to a control signal supplied by an external component such as a timing controller. The data signal provided to the data line (DAm) is supplied to the pixel 150, the pixel 150 being selected by a scan signal each time when the scan signal is supplied to the first scan line (SC2n) or the second scan line (SC2n-1). The pixel 150 charges a voltage corresponding to the data signal and emits light having a luminance corresponding to the voltage. The data driver 230 may be included in the driving chip 350, the driving chip 350 being disposed on the printed circuit board (PCB) 300. However, the data driver 230 may also be included in the substrate (SUB), as shown in FIG. 3.

The data wires (DW) are provided on the second gate wires GW2, with a third insulating layer (ILD) disposed between the data wires (DW) and the second gate wires GW2. The data wires (DW) are extended in the second direction (Y axis) crossing the first direction (X axis). The data wires (DW) include data lines (DA1-DAm) and a driving power line (ELVDDL). The data line (DAm) is connected to the data driver 230 and receives a data signal from the data driver 230. The driving power line (ELVDDL) is connected to a first power source (ELVDD), to be described below, and receives driving power from the first power source (ELVDD).

The driving power line (ELVDDL) and the data line (DAm) may be formed on a same layer on the third insulating layer (ILD). However, the driving power line (ELVDDL) and the data line (DAm) may also be formed on different layers.

For example, the driving power line (ELVDDL) may be provided on a same layer as the first gate wire GW1, and the data line (DAm) may be provided on a same layer as the second gate wire GW2. Alternately, the driving power line (ELVDDL) may be formed on a same layer as the second gate wire GW2, and the data line (DAm) may be formed on a same layer as the first gate wire GW1.

The display unit 140 includes a plurality of pixels 150 provided in regions of the first gate wires GW1, the second gate wires GW2, and the data wires (DW) cross each other. A pixel 150 includes an organic light emitting element for emitting light with a luminance depending on a driving current of the data signal. A pixel circuit controls the driving current flowing to the organic light emitting element.

The pixel circuit is connected to the first gate wires GW1, the second gate wires GW2, and the data wires (DW), and the organic light emitting element is connected to the pixel circuit. The pixel 150 is described as an organic light emitting element. However, the present invention is not limited thereto, and the pixel 150 may be a liquid crystal display element or an electrophoretic display element.

An organic light emitting element of a pixel 150 included of the display unit 140 may be connected to the pixel circuit, and the pixel circuit may be connected to an external first power source (ELVDD). The organic light element of the pixel 150 may also be connected to a second power source (ELVSS). The first power source (ELVDD) and the second power source (ELVSS) supply driving power and common power to the pixels 150 of the display unit 140. A pixel 150 receives a data signal based on the driving power and the common power to emit light. The luminance of the light depends on the driving current passing through the organic light emitting element of the pixel 150. The driving current is received from the first power source (ELVDD).

In an exemplary embodiment of the present invention, the gate wire that traverses the pixels 150 in the first direction (X axis) do not overlap each other. For example, the first gate wires GW1 and second gate wires GW2 are not provided on the same layer, but the first gate wires GW1 and the second gate wires GW2 are provided on different layers with a second insulating layer GI2 disposed therebetween. Thus, a distance (W) between neighboring gate wires, provided on the different layers, may be small. Accordingly, a greater number of pixels 150 may be disposed in a same area. Thus, a high-resolution display device may be provided.

A configuration of first pad terminals (PAD_TL_A) disposed in the first terminal region (TL_1) will now be described in detail with reference to FIG. 5. The first pad terminals (PAD_TL_A) disposed in the first terminal region (TL_1) may have the same configuration as the first pad terminals disposed in the second terminal region (TL_2).

Figure 5:
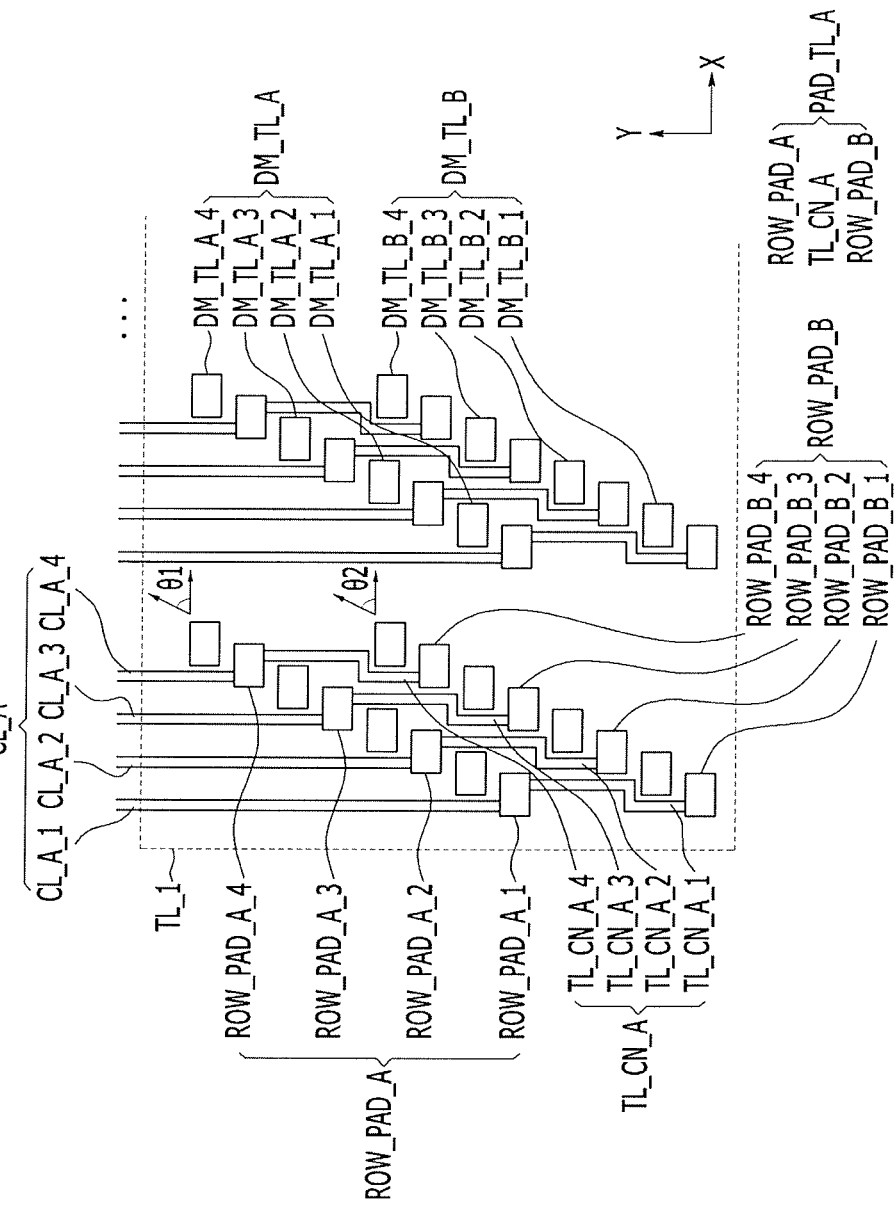
FIG. 5 is a plan view illustrating an enlarged drawing of a first terminal region of FIG. 1, according to an exemplary embodiment of the present invention.

FIG. 5 is a plan view illustrating an enlarged drawing of a first terminal region (TL_1) of FIG. 1, according to an exemplary embodiment of the present invention.

Referring to FIG. 5, a plurality of first pad terminals (PAD_TL A) may be disposed in the first terminal region (TL_1). The first pad terminals (PAD_TL_A) may be respectively separated from each other at regular intervals and may be disposed in the first direction (X axis) in the first terminal region (TL_1).

The first pad terminals (PAD_TL_A) may include first-row sub-pad terminals (ROW_PAD_A), second-row sub-pad terminals (ROW_PAD_B), and first terminal connecting lines (TL_CN_A).

In an exemplary embodiment of the present invention, the first-row sub-pad terminals (ROW_PAD_A) may be separated from each other and may be disposed in a predetermined direction. The first-row sub-pad terminals (ROW_PAD_A) may form a first inclination angle $\theta 1$ with respect to the first direction (X axis). For example, the first-row sub-pad terminals (ROW_PAD_A) may be disposed along a line which is inclined by the first inclination angle $\theta 1$ with respect to the first direction (X axis). The first inclination angle $\theta 1$ may be greater than 0 degrees and less than 90 degrees.

The intervals of adjacent first-row sub-pad terminals (ROW_PAD_A) may be the same. For example, an interval between the first-row sub-pad terminal (ROW_PAD_A_1) and the first-row sub-pad terminal (ROW_PAD_A_2), an interval between the first-row sub-pad terminal (ROW_PAD_A_2) and the first-row sub-pad terminal (ROW_PAD_A_3), and an interval between the first-row sub-pad terminal (ROW_PAD_A_3) and the first-row sub-pad terminal (ROW_PAD_A_4) may be the same.

The first-row sub-pad terminals (ROW_PAD_A) represent regions electrically contacting third-row sub-pad terminals (ROW_PAD_C, refer to FIG. 7) of the printed circuit board (PCB) 300. The first-row sub-pad terminals (ROW_PAD_A) may be formed to have a substantially quadrangular shape.

The second-row sub-pad terminals (ROW_PAD_B) may be separated from the first-row sub-pad terminals (ROW_PAD_A) and may be disposed in the second direction (Y axis). The second-row sub-pad terminals (ROW_PAD_B) may be separated from each other and may be disposed in a predetermined direction. The second-row sub-pad terminals (ROW_PAD_B) may form a second inclination angle $\theta 2$ with respect to the first direction (X axis). For example, the second-row sub-pad terminals (ROW_PAD_B) may be disposed along a line which is inclined by the second inclination angle $\theta 2$ with respect to the first direction (X axis). The second inclination angle $\theta 2$ may be greater than 0 degrees and less than 90 degrees.

In an exemplary embodiment of the present invention, the first inclination angle $\theta 1$ may be the same as the second inclination angle $\theta 2$. Therefore, the direction along which the first-row sub-pad terminals (ROW_PAD_A) and the second-row sub-pad terminals (ROW_PAD_B) are disposed may be inclined by the same angle with respect to the first direction (X axis). However, the present invention is not limited thereto, and the first inclination angle $\theta 1$ may be different from the second inclination angle $\theta 2$. For example, the direction along which the first-row sub-pad terminals (ROW_PAD_A) and the second-row sub-pad terminals (ROW_PAD_B) are disposed may be inclined by different angles with respect to the first direction (X axis).

The intervals of adjacent second-row sub-pad terminals (ROW_PAD_B) may correspond to each other. For example, a gap between the second-row sub-pad terminal (ROW_PAD_B_1) and the second-row sub-pad terminal (ROW_PAD_B_2), a gap between the second-row sub-pad terminal (ROW_PAD_B_2) and the second-row sub-pad terminal (ROW_PAD_B_3), and a gap between the second-row sub-pad terminal (ROW_PAD_B_3) and the second-row sub-pad terminal (ROW_PAD_B_4) may be the same.

The second-row sub-pad terminals (ROW_PAD_B) represent regions electrically contacting the fourth-row sub-pad terminals (ROW_PAD_D, refer to FIG. 7) of the printed circuit board (PCB) 300. The second-row sub-pad terminals (ROW_PAD_B) may be formed to have a substantially quadrangular shape.

A plurality of first-row sub-pad terminals (ROW_PAD_A) may be connected to a plurality of second-row sub-pad terminals (ROW_PAD_B) by a plurality of first terminal connecting lines (TL_CN_A). For example, each of a plurality of first terminal connecting lines (TL_CN_A) may connect one of a plurality of first-row sub-pad terminals (ROW_PAD_A) and one of a plurality of second-row sub-pad terminals (ROW_PAD_B).

For example, the first-row sub-pad terminal (ROW_PAD_A_1) may be connected to the second-row sub-pad terminal (ROW_PAD_B_1) by the first terminal connecting line (TL_CN_A_1). The first-row sub-pad terminal (ROW_PAD_A_2) may be connected to the second-row sub-pad terminal (ROW_PAD_B_2) by the first terminal connecting line (TL_CN_A_2). The first-row sub-pad terminal (ROW_PAD_A_3) may be connected to the second-row sub-pad terminal (ROW_PAD_B_3) by the first terminal connecting line (TL_CN_A_3). The first-row sub-pad terminal (ROW_PAD_A_4) may be connected to the second-row sub-pad terminal (ROW_PAD_B_4) by the first terminal connecting line (TL_CN_A_4).

According to an exemplary embodiment of the present invention, a plurality of first terminal connecting lines (TL_CN_A) may respectively have a shape that is bent at least once. For example, as shown in FIG. 5, the first terminal connecting line (TL_CN_A_1) extends to the first-row sub-pad terminal (ROW_PAD_A_1) from the second-row sub-pad terminal (ROW_PAD_B_1) in the second direction (Y axis). In addition, the first terminal connecting line (TL_CN_A_1) may be bent in the first direction (X axis) and may then be bent in the second direction (Y axis). For example, the first terminal connecting line (TL_CN_A_1) may be bent twice.

A plurality of first-row sub-pad terminals (ROW_PAD_A) may be connected to the first connection lines (CL A). For example, the first-row sub-pad terminal (ROW_PAD_A_1) may be connected to the first connection line (CL_A_1), and the first-row sub-pad terminal (ROW_PAD_A_2) may be connected to the first connection line (CL A 2). The first-row sub-pad terminal (ROW_PAD_A_3) may be connected to the first connection line (CL_A_3), and the first-row sub-pad terminal (ROW_PAD_A_4) may be connected to the first connection line (CL_A_4).

At least one first dummy pad terminal (DM_TL_A) may be disposed between a pair of adjacent first-row sub-pad terminals (ROW_PAD_A), from among a plurality of first-row sub-pad terminals (ROW_PAD_A). For example, one first dummy pad terminal (DM TL_A_1) may be disposed between the first-row sub-pad terminal (ROW_PAD_A_1) and the first-row sub-pad terminal (ROW_PAD_A_2), and one first dummy pad terminal (DM_TL_A_2) may be disposed between the first-row sub-pad terminal (ROW_PAD_A_2) and the first-row sub-pad terminal (ROW_PAD_A_3). One first dummy pad terminal (DM_TL_A_3) may be disposed between the first-row sub-pad terminal (ROW_PAD_A_3) and the first-row sub-pad terminal (ROW_PAD_A_4), and one first dummy pad terminal (DM_TL_A_4) may be disposed near the first-row sub-pad terminal (ROW_PAD_A_4).

FIG. 5 shows that one first dummy pad terminal (DM_TL_A) is disposed between a pair of adjacent first-row sub-pad terminals (ROW_PAD_A). However, the present invention is not limited thereto, and two or more first dummy pad terminals (DM_TL_A) may be disposed between a pair of adjacent first-row sub-pad terminals (ROW_PAD_A).

The first-row sub-pad terminals (ROW_PAD_A) may be arranged in parallel with the first dummy pad terminal (DM_TL_A). For example, the first-row sub-pad terminals (ROW_PAD_A) and the first dummy pad terminal (DM_TL_A) may be arranged in a series along a predetermined direction, which is inclined by the first inclination angle θ1 with respect to the first direction (X axis).

At least one first dummy pad terminal (DM_TL_A) is disposed between a pair of adjacent first-row sub-pad terminals (ROW_PAD_A) so a distance between the adjacent first-row sub-pad terminals (ROW_PAD_A) is increased. Accordingly, capacitive coupling may be prevented from being generated between the first-row sub-pad terminals (ROW_PAD_A).

In addition, at least one second dummy pad terminal (DM_TL_B) may be disposed between a pair of adjacent second-row sub-pad terminals (ROW_PAD_B), from among a plurality of second-row sub-pad terminals (ROW_PAD_B). For example, one second dummy pad terminal (DM_TL_B_1) may be disposed between the second-row sub-pad terminal (ROW_PAD_B_1) and the second-row sub-pad terminal (ROW_PAD_B_2), and one second dummy pad terminal (DM_TL_B_2) may be disposed between the second-row sub-pad terminal (ROW_PAD_B_2) and the second-row sub-pad terminal (ROW_PAD_B_3). One second dummy pad terminal (DM_TL_B_3) may be disposed between the second-row sub-pad terminal (ROW_PAD_B_3) and the second-row sub-pad terminal (ROW_PAD_B_4), and one second dummy pad terminal (DM_TL_B_4) may be disposed near the second-row sub-pad terminal (ROW_PAD_B_4).

FIG. 5 shows that one second dummy pad terminal (DM_TL_B) is disposed between a pair of adjacent second-row sub-pad terminals (ROW_PAD_B). However, the present invention is not limited thereto, and at least two second dummy pad terminals (DM_TL_B) may be disposed.

The second-row sub-pad terminals (ROW_PAD_B) and the second dummy pad terminal (DM_TL_B) may be provided in parallel with each other. For example, the second-row sub-pad terminals (ROW_PAD_B) and the second dummy pad terminal (DM_TL_B) may be arranged in a series along a predetermined direction, which is inclined by the second inclination angle θ2 with respect to the first direction (X axis).

In an exemplary embodiment of the present invention, the first-row sub-pad terminals (ROW_PAD_A) and the second-row sub-pad terminals (ROW_PAD_B) are inclined at a predetermined angle with respect to the first direction (X axis) and are disposed so a large number of pad terminals may be disposed in a given or predetermined area.

A printed circuit board (PCB) 300 electrically connected to a display device, according to an exemplary embodiment of the present invention, will now be described with reference to FIG. 6 to FIG. 8.

Figure 6:
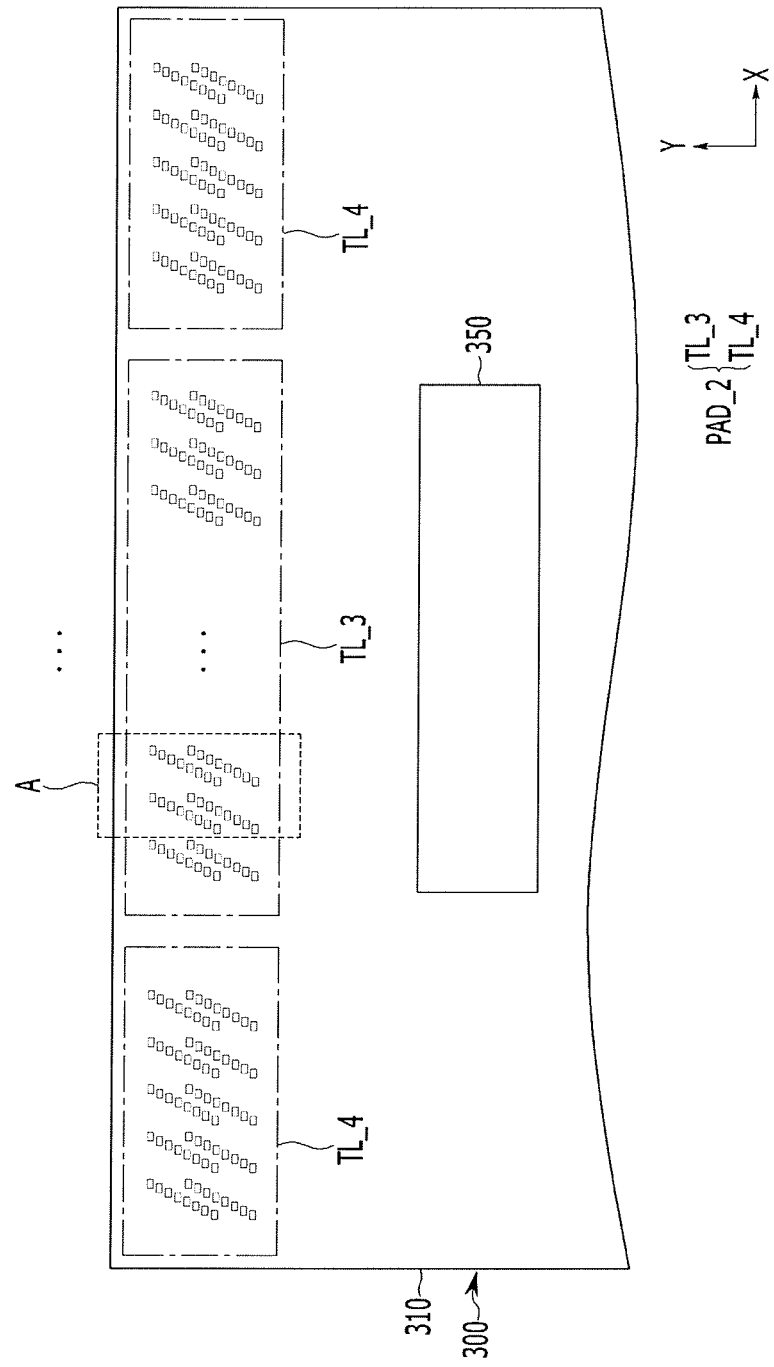
FIG. 6 is a plan view illustrating a printed circuit board (PCB) electrically connected to the display device of FIG. 1, according to an exemplary embodiment of the present invention.

FIG. 6 is a plan view illustrating a printed circuit board (PCB) electrically connected to the display device of FIG. 1, according to an exemplary embodiment of the present invention. FIG. 7 is an enlarged view of a region A of FIG. 6, according to an exemplary embodiment of the present invention. FIG. 8 is a cross-sectional view taken along line VIII-VIII' of FIG. 7, according to an exemplary embodiment of the present invention.

Referring to FIG. 6, the printed circuit board (PCB) 300 may include a base film 310, a second pad portion (PAD_2), and a driving chip 350.

The second pad portion (PAD_2) may be disposed on an edge or end portion of the flexible base film 310. According to an exemplary embodiment of the present invention, the second pad portion (PAD_2) may have a shape corresponding to a shape of the first pad portion (PAD_1) of the display substrate (SUB). The second pad portion (PAD_2) of the printed circuit board (PCB) 300 and the first pad portion (PAD_1) of the display substrate (SUB) have shapes corresponding to each other so the first pad portion (PAD_1) may be electrically combined to the second pad portion (PAD_2).

The second pad portion (PAD_2) may include a third terminal region (TL_3) and a fourth terminal region (TL_4). The third terminal region (TL_3) and the fourth terminal region (TL_4) indicate regions that are provided on the base film 310. The third terminal region (TL_3) and the fourth terminal region (TL_4) may be arranged in parallel on the base film 310 in the first direction (X axis). For example, the third terminal region (TL_3) and the fourth terminal region (TL_4) may be consecutively arranged along a predetermined direction.

According to an exemplary embodiment of the present invention, fourth terminal regions (TL_4) may be disposed on respective sides of the third terminal region (TL_3). However, the present invention is not limited thereto, and a fourth terminal region (TL_4) may be disposed between a pair of third terminal regions (TL_3).

However, the arrangement of the third terminal region (TL_3) and the fourth terminal region (TL_4) is determined by the arrangement of the first terminal region (TL_1) and the second terminal region (TL_2) disposed on the display substrate (SUB). For example, when the second terminal region (TL_2) is disposed on respective sides of the first terminal region (TL_1), the fourth terminal region (TL_4) may be disposed on respective sides of the third terminal region (TL_3). When the second terminal region (TL_2) is disposed between a pair of first terminal regions (TL_1), the fourth terminal region (TL_4) may be disposed between a pair of third terminal regions (TL_3).

Figure 7:
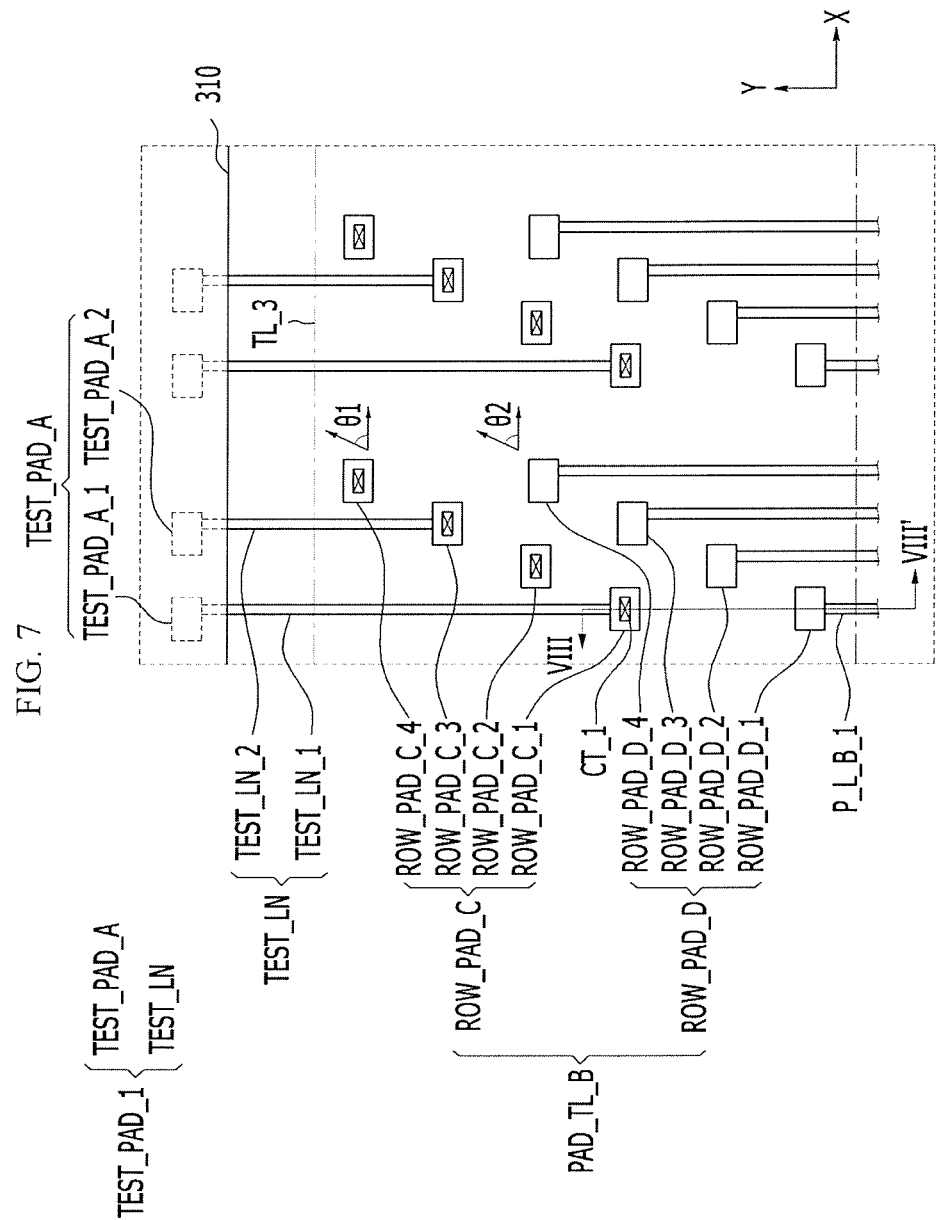
FIG. 7 is an enlarged view of a region A of FIG. 6, according to an exemplary embodiment of the present invention.
Figure 8:
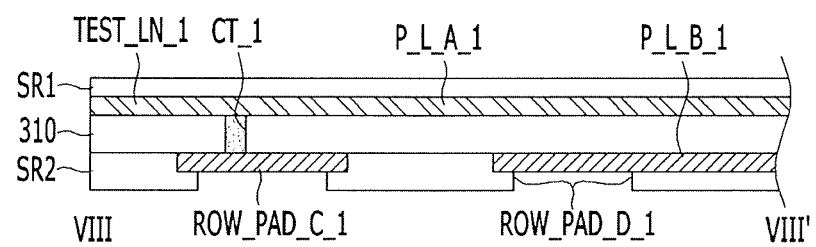
FIG. 8 is a cross-sectional view taken along line VIII-VIII' of FIG. 7, according to an exemplary embodiment of the present invention.

Referring to FIG. 7 and FIG. 8, the third terminal region (TL_3) represents a region corresponding to the first terminal region (TL_1) of the display substrate (SUB). A plurality of second pad terminals (PAD_TL_B) may be disposed in the third terminal region (TL_3). FIG. 7 and FIG. 8 illustrate a plurality of second pad terminals (PAD_TL_B) disposed in the third terminal region (TL_3). However, a plurality of second pad terminals (PAD_TL_B) disposed in the fourth terminal region (TL_4) may have the same arrangement as the plurality of second pad terminals (PAD_TL_B) shown in FIG. 7.

The second pad terminals (PAD_TL_B) may be disposed in a same pattern as the first pad terminals (PAD_TL_A) disposed in the first terminal region (TL_1). For example, the second pad terminals (PAD_TL_B) may have the same arrangement as the first pad terminals (PAD_TL_A).

The second pad terminals (PAD_TL_B) may respectively include third-row sub-pad terminals (ROW_PAD_C) and fourth-row sub-pad terminals (ROW_PAD_D).

In an exemplary embodiment of the present invention, the third-row sub-pad terminals (ROW_PAD_C) may be separated from each other and may be disposed in a predetermined direction. The third-row sub-pad terminals (ROW_PAD_C) may form the first inclination angle $\theta 1$ with respect to the first direction (X axis). The third-row sub-pad terminals (ROW_PAD_C) may be inclined by the first inclination angle $\theta 1$ with respect to the first direction (X axis). For example, the third-row sub-pad terminals (ROW_PAD_C) may be inclined at the same angle as the first-row sub-pad terminals (ROW_PAD_A) of the display substrate (SUB). The first inclination angle $\theta 1$ may be greater than 0 degrees and less than 90 degrees.

The intervals among the adjacent third-row sub-pad terminals (ROW_PAD_C) may be the same. For example, the gap between the third-row sub-pad terminal (ROW_PAD_C_1) and the third-row sub-pad terminal (ROW_PAD_C_2), the gap between the third-row sub-pad terminal (ROW_PAD_C_2) and the third-row sub-pad terminal (ROW_PAD_C_3), and the gap between the third-row sub-pad terminal (ROW_PAD_C_3) and the third-row sub-pad terminal (ROW_PAD_C_4) may be the same. The adjacent third-row sub-pad terminals (ROW_PAD_C) may be arranged at the same intervals, like the first-row sub-pad terminals (ROW_PAD_A).

The third-row sub-pad terminals (ROW_PAD_C) represent the regions electrically contacting the first-row sub-pad terminals (ROW_PAD_A) of the display substrate (SUB). The third-row sub-pad terminals (ROW_PAD_C) may have a quadrangular shape.

The fourth-row sub-pad terminals (ROW_PAD_D) may be separated from the third-row sub-pad terminals (ROW_PAD_C). The fourth-row sub-pad terminals (ROW_PAD_D) may be disposed in the second direction (Y axis). The fourth-row sub-pad terminals (ROW_PAD_D) may be separated from each other and may be disposed in a predetermined direction, similarly to the third-row sub-pad terminals (ROW_PAD_C).

The fourth-row sub-pad terminals (ROW_PAD_D) may form the second inclination angle $\theta 2$ with respect to the first direction (X axis). For example, the fourth-row sub-pad terminals (ROW_PAD_D) may be inclined by the second inclination angle $\theta 2$ with respect to the first direction (X axis). For example, the fourth-row sub-pad terminals (ROW_ PAD_D) may be inclined at the same angle as the second-row sub-pad terminals (ROW_PAD_B) of the display substrate (SUB). The second inclination angle $\theta 2$ may be greater than 0 degrees and less than 90 degrees.

In an exemplary embodiment of the present invention, the first inclination angle $\theta 1$ may correspond to the second inclination angle $\theta 2$. Therefore, the third-row sub-pad terminals (ROW_PAD_C) and the fourth-row sub-pad terminals (ROW_PAD_D) may be inclined by the same angle and may be arranged in the first direction (X axis).

However, the present invention is not limited thereto, and the first inclination angle $\theta 1$ may be different from the second inclination angle $\theta 2$. Accordingly, the third-row sub-pad terminals (ROW_PAD_C) and the fourth-row sub-pad terminals (ROW_PAD_D) may be inclined at different angles with respect to the first direction (X axis).

The gaps of the adjacent fourth-row sub-pad terminals (ROW_PAD_D) may be the same. For example, the gap between the fourth-row sub-pad terminal (ROW_PAD_D_1) and the fourth-row sub-pad terminal (ROW_PAD_D_2), the gap between the fourth-row sub-pad terminal (ROW_PAD_D_2) and the fourth-row sub-pad terminal (ROW_PAD_D_3), and the gap between the fourth-row sub-pad terminal (ROW_PAD_D_3) and the fourth-row sub-pad terminal (ROW_PAD_D_4) may be the same.

The fourth-row sub-pad terminals (ROW_PAD_D) represent the regions electrically contacting the second-row sub-pad terminals (ROW_PAD_B) of the display substrate (SUB). The fourth-row sub-pad terminals (ROW_PAD_D) may be provided to form a substantially quadrangular shape.

A first terminal wire (P_L_A_1) and a second terminal wire (P_L_B_1) may be provided on respective sides, for example, on an upper side and a lower side, of the base film 310. The first terminal wire (P_L_A_1) may be provided above the base film 310, and the second terminal wire (P_L_B_1) may be provided below the base film 310. The first terminal wire (P_L_A_1) and the second terminal wire (P_L_B_1) may be electrically connected to the driving chip 350.

A first passivation layer SR1 may be disposed above the first terminal wire (P_L_A_1), and the second terminal wire (P_L_B_1) may be disposed below a second passivation layer SR2. The first passivation layer SR1 and the second passivation layer SR2 may be a solder resist.

The third-row sub-pad terminal (ROW_PAD_C_1) and the fourth-row sub-pad terminal (ROW_PAD_D_1) may be provided on a same layer as the second terminal wire (P_L_B_1). A part of the second passivation layer SR2 may be removed and a part of the second terminal wire (P_L_B_1) may be exposed to expose the third-row sub-pad terminal (ROW_PAD_C_1) and the fourth-row sub-pad terminal (ROW_PAD_D_1). The third-row sub-pad terminal (ROW_PAD_C_1) and the fourth-row sub-pad terminal (ROW_PAD_D_1) are separated from each other.

The third-row sub-pad terminal (ROW_PAD_C_1) may be electrically connected to the first terminal wire (P_L_A_1) through a first contact hole CT_1, provided in the base film 310. In plan view, the first contact hole CT_1 may be disposed to overlap the third-row sub-pad terminal (ROW_PAD_C_1). The first contact hole CT_1 may be filled with a same metal as the first terminal wire (P_L_A_1), or may be filled with a metal forming the third-row sub-pad terminal (ROW_PAD_C_1).

The fourth-row sub-pad terminal (ROW_PAD_D_1) may be included in a same metal layer as the second terminal wire (P_L_B_1). The fourth-row sub-pad terminal (ROW_PAD_D_1) may correspond to a region in which part of the second terminal wire (P_L_B_1) is exposed.

A first test line (TEST_LN) may be connected to some of the third-row sub-pad terminals (ROW_PAD_C). For example, the first test line (TEST_LN) may be connected to some of the third-row sub-pad terminals (ROW_PAD_C), and the first test line (TEST_LN) might not be connected to others of the third-row sub-pad terminals (ROW_PAD_C).

As shown in FIG. 7, the first test line (TEST_LN) is connected to the third-row sub-pad terminal (ROW_PAD_C_1) and the third-row sub-pad terminal (ROW_PAD_C_3), from among the third-row sub-pad terminals (ROW_PAD_C). A first test line (TEST_LN_1) may be connected to the third-row sub-pad terminal (ROW_PAD_C_1), and a first test line (TEST_LN_2) may be connected to the third-row sub-pad terminal (ROW_PAD_C_3). The first test line (TEST_LN) is not connected to the third-row sub-pad terminal (ROW_PAD_C_2) and the third-row sub-pad terminal (ROW_PAD_C_4).

The first test line (TEST_LN) may extend in an upper-side direction along the second direction (Y axis), as shown in FIG. 7. The first test line (TEST_LN) may extend to an upper-side end portion of the base film 310. Before the printed circuit board (PCB) 300 is attached to the display substrate (SUB), a first test pad terminal (TEST_PAD_A) may be provided on the upper side of the first test line (TEST_LN). For example, a first test pad portion (TEST_PAD_1) including the first test line (TEST_LN) and the first test pad terminal (TEST_PAD_A) is provided on the printed circuit board (PCB) 300. For example, the first test pad terminal (TEST_PAD_A_1) may be provided on the upper side of the first test line (TEST_LN_1), and the first test pad terminal (TEST_PAD_A_2) may be provided on the upper side of the first test line (TEST_LN_2).

However, when the printed circuit board (PCB) 300 is attached to the display substrate (SUB), the first test pad terminal (TEST_PAD_A) is separated so part of the first test line (TEST_LN) remains on the printed circuit hoard (PCB) 300 attached to the display substrate (SUB), which will be described below.

The first test line (TEST_LN_1) may be electrically connected to the third-row sub-pad terminal (ROW_PAD_C_1) through the first contact hole CT_1. The first test line (TEST_LN_1) may be included on the same layer as the first terminal wire (P_L_A_1).

The first test pad portion (TEST_PAD_1), disposed on a second pad terminal (PAD_TL_B) of a printed circuit board (PCB) 300, will now be described in detail with reference to FIG. 9 to FIG. 11.

Figure 9:
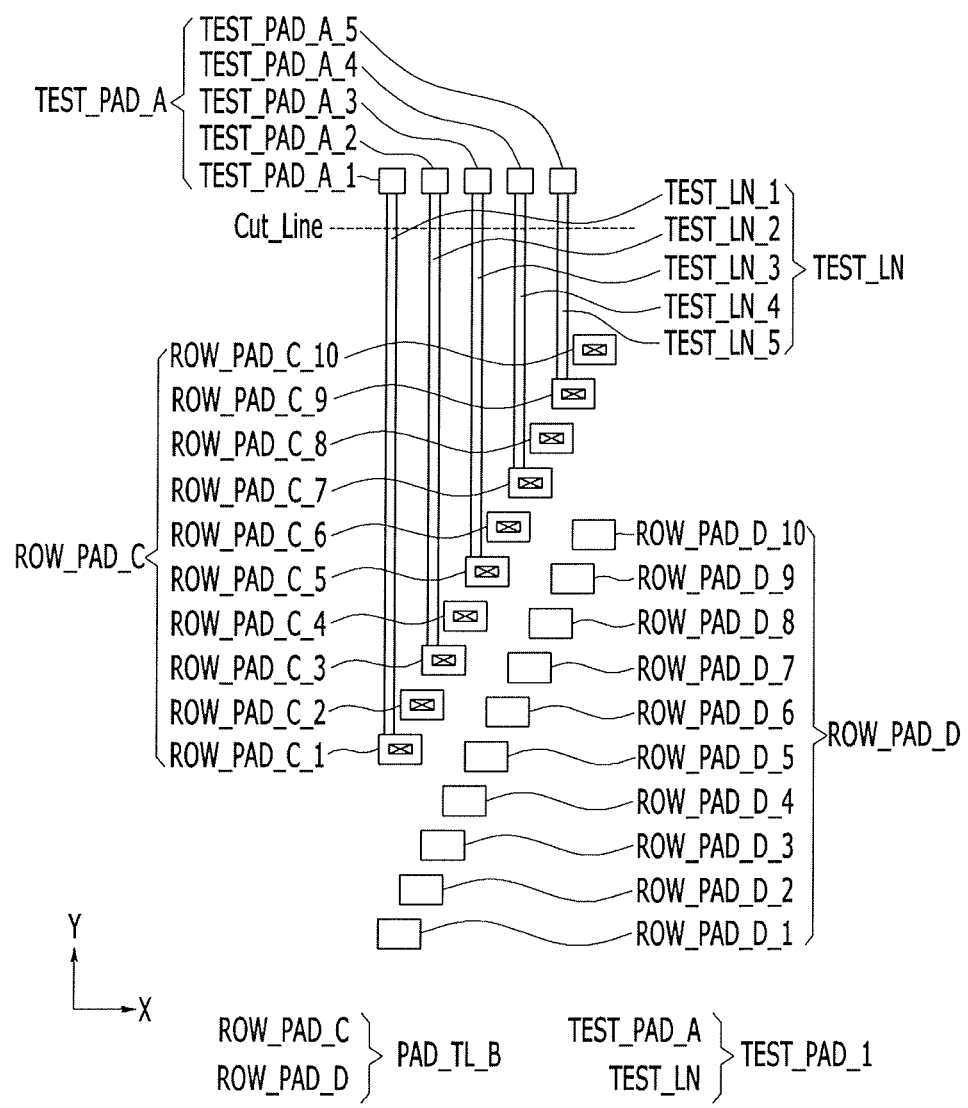
FIG. 9 is a plan view illustrating that second pad terminals of FIG. 7 are connected to a first test pad portion, according to an exemplary embodiment of the present invention.

FIG. 9 is a plan view illustrating that second pad terminals of FIG. 7 are connected to a first test pad portion, according to an exemplary embodiment of the present invention. FIG. 10 is a plan view illustrating a first test pad portion that is incised along a cutting line of FIG. 9, according to an exemplary embodiment of the present invention. FIG. 11 is a plan view illustrating that a probe contacts second pad terminals and first test pad terminals of FIG. 9, according to an exemplary embodiment of the present invention.

Figure 10:
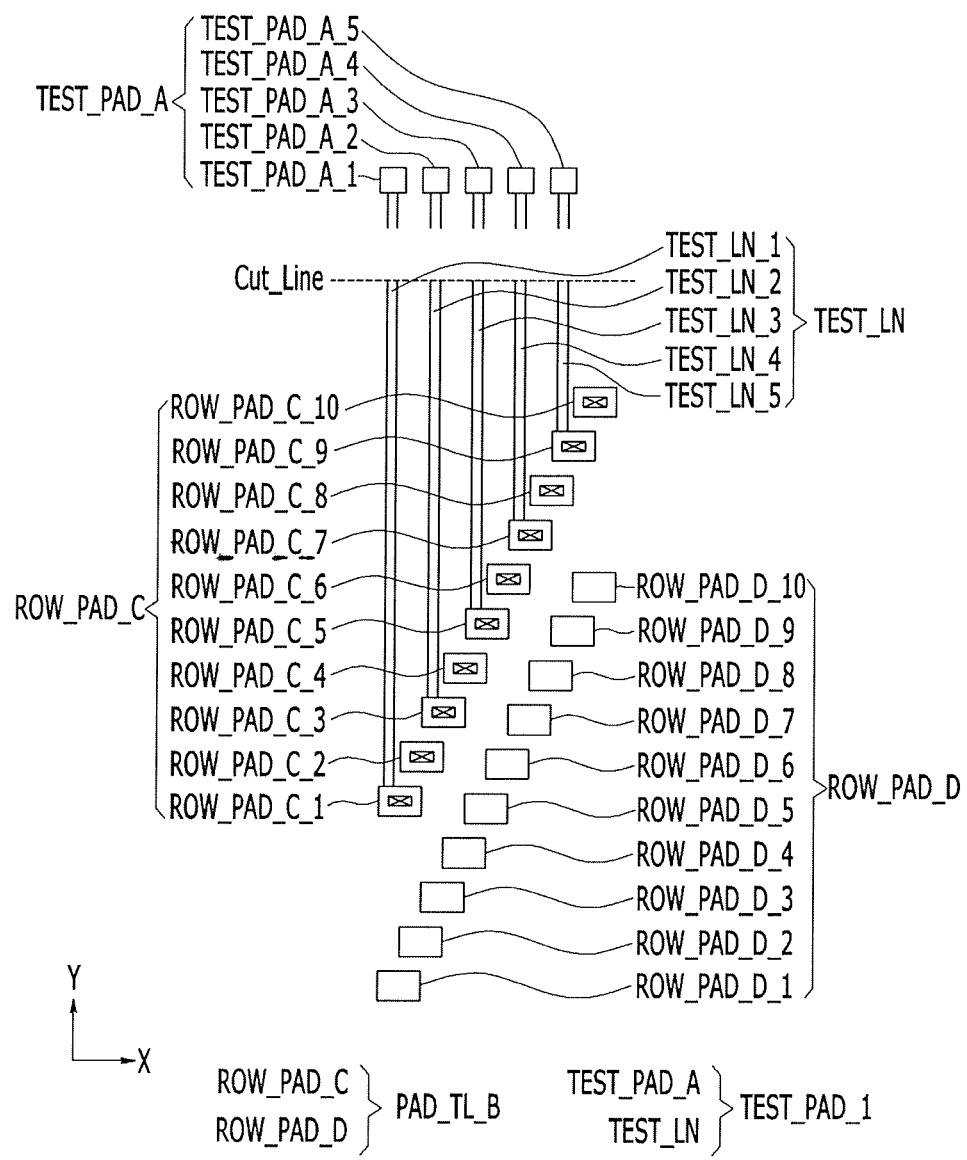
FIG. 10 is a plan view illustrating a first test pad portion that is incised along a cutting line of FIG. 9, according to an exemplary embodiment of the present invention.
Figure 11:
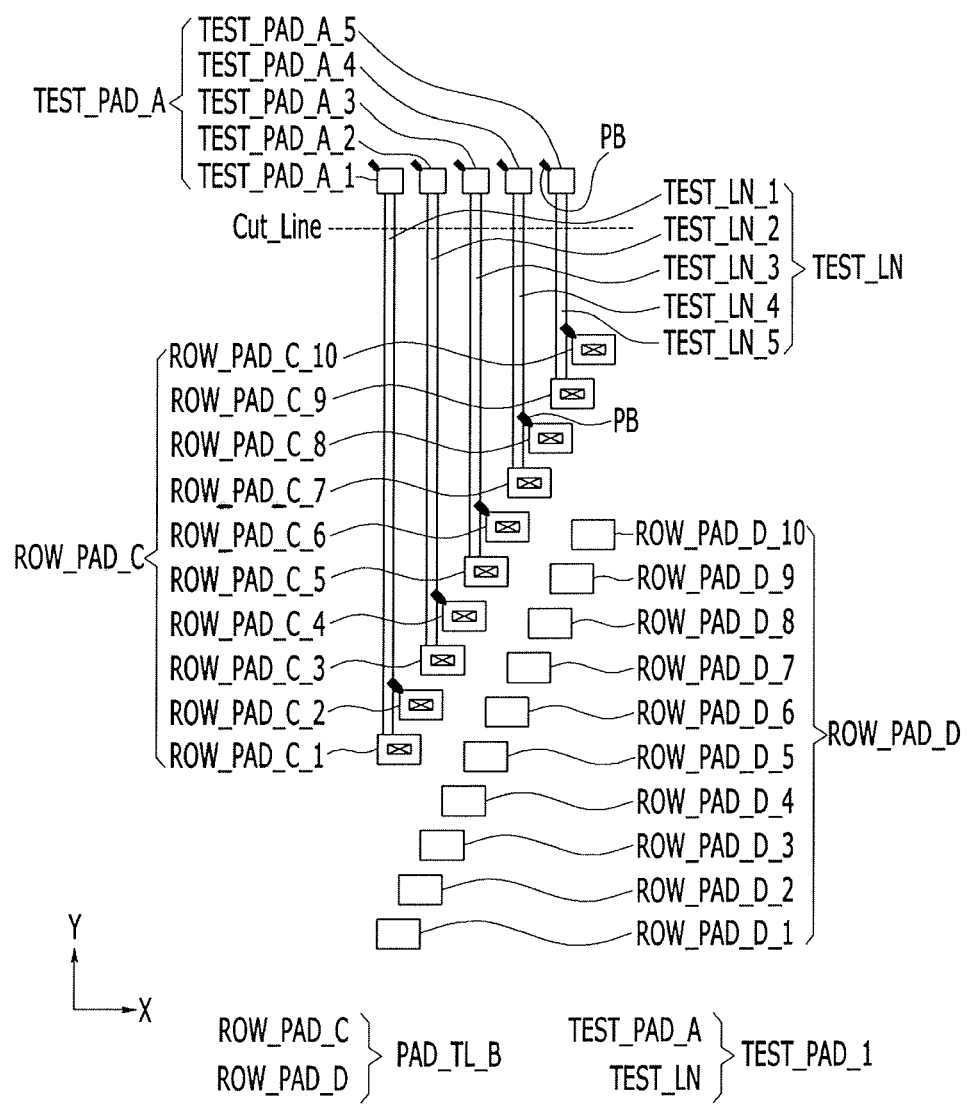
FIG. 11 is a plan view illustrating that a probe contacts second pad terminals and first test pad terminals of FIG. 9, according to an exemplary embodiment of the present invention.

Referring to FIG. 9 to FIG. 11, the second pad terminals (PAD_TL_B) may include third-row sub-pad terminals (ROW_PAD_C) and fourth-row sub-pad terminals (ROW_PAD_D). As described with reference to FIG. 7, the third-row sub-pad terminals (ROW_PAD_C) may be inclined at a constant angle with respect to the first direction (X axis). The fourth-row sub-pad terminals (ROW_PAD_D) may be separated from the third-row sub-pad terminals (ROW_PAD_C) and may be disposed in the second direction (Y axis). The fourth-row sub-pad terminals (ROW_PAD_D) may be inclined at a constant angle with respect to the first direction (X axis).

In an exemplary embodiment of the present invention, the first test pad portion (TEST_PAD_1) may be disposed to be adjacent to the third-row sub-pad terminals (ROW_PAD_C). The first test pad portion (TEST_PAD_1) may include the first test pad terminal (TEST_PAD_A) and the first test line (TEST_LN).

The first test line (TEST_LN) may be connected to some of the third-row sub-pad terminals (ROW_PAD_C_1, ROW_PAD_C_3, ROW_PAD_C_5, ROW_PAD_C_7, and ROW_PAD_C_9), from among the third-row sub-pad terminals (ROW_PAD_C). For example, the first test line (TEST_LN_1) may be connected to the third-row sub-pad terminal (ROW_PAD_C_1), the first test line (TEST_LN_2) may be connected to the third-row sub-pad terminal (ROW_PAD_C_3), and the first test line (TEST_LN_3) may be connected to the third-row sub-pad terminal (ROW_PAD_C_5). The first test line (TEST_LN_4) may be connected to the third-row sub-pad terminal (ROW_PAD_C_7), and the first test line (TEST_LN_5) may be connected to the third-row sub-pad terminal (ROW_PAD_C_9).

The first test line (TEST_LN) is not connected to the other third-row sub-pad terminals (ROW_PAD_C_2, ROW_PAD_C_4, ROW_PAD_C_6, ROW_PAD_C_8, and ROW_PAD_C_10), from among the third-row sub-pad terminals (ROW_PAD_C).

In an exemplary embodiment of the present invention, at least one of the third-row sub-pad terminals (ROW_PAD_C_1, ROW_PAD_C_3, ROW_PAD_C_5, ROW_PAD_C_7, and ROW_PAD_C_9), connected to the first test line (TEST_LN), may be disposed among the third-row sub-pad terminals (ROW_PAD_C_2, ROW_PAD_C_4, ROW_PAD_C_6, ROW_PAD_C_8, and ROW_PAD_C_10), to which the first test line (TEST_LN) is not connected.

In FIG. 9, one of the third-row sub-pad terminals (ROW_PAD_C_1, ROW_PAD_C_3, ROW_PAD_C_5, ROW_PAD_C_7, and ROW_PAD_C_9) is disposed among the third-row sub-pad terminals (ROW_PAD_C_2, ROW_PAD_C_4, ROW_PAD_C_6, ROW_PAD_C_8, and ROW_PAD_C_10), to which the first test line (TEST_LN) is not connected.

For example, the third-row sub-pad terminal (ROW_PAD_C_3) may be disposed between the third-row sub-pad terminals (ROW_PAD_C_2 and ROW_PAD_C_4), and the third-row sub-pad terminal (ROW_PAD_C_5) may be disposed between the third-row sub-pad terminals (ROW_PAD_C_4 and ROW_PAD_C_6). The third-row sub-pad terminal (ROW_PAD_C_7) may be disposed between the third-row sub-pad terminals (ROW_PAD_C_6 and ROW_PAD_C_8), and the third-row sub-pad terminal (ROW_PAD_C_9) may be disposed between the third-row sub-pad terminals (ROW_PAD_C_8 and ROW_PAD_C_10).

As described, each of the third-row sub-pad terminals (ROW_PAD_C_1, ROW_PAD_C_3, ROW_PAD_C_5, ROW_PAD_C_7, and ROW_PAD_C_9), connected to the first test line (TEST_LN), may be disposed among the third-row sub-pad terminals (ROW_PAD_C_2, ROW_PAD_C_4, ROW_PAD_C_6, ROW_PAD_C_8, and ROW_PAD_C_10), to which the first test line (TEST_LN) is not connected. For example, the third-row sub-pad terminals (ROW_PAD_C_2, ROW_PAD_C_4, ROW_PAD_C_6, ROW_PAD_C_8, and ROW_PAD_C_10), to which the first test line (TEST_LN) is not connected, and the third-row sub-pad terminals (ROW_PAD_C_1, ROW_PAD_C_3, ROW_PAD_C_5, ROW_PAD_C_7, and ROW_PAD_C_9), to which the first test line (TEST_LN) is connected, may be alternately disposed.

Accordingly, the first test pad terminals (TEST_PAD_A), connected to the first test line (TEST_LN), may be separated from each other at regular intervals and may be disposed in the first direction.

However, the present invention is not limited thereto, and third-row sub-pad terminals, to which at least two first test lines (TEST_LN) are connected, may be disposed among the third-row sub-pad terminals (ROW_PAD_C_2, ROW_PAD_C_4, ROW_PAD_C_6 ROW_PAD_C_8, and ROW_PAD_C_10), to which the first test line (TEST_LN) is not connected.

Figure 12:
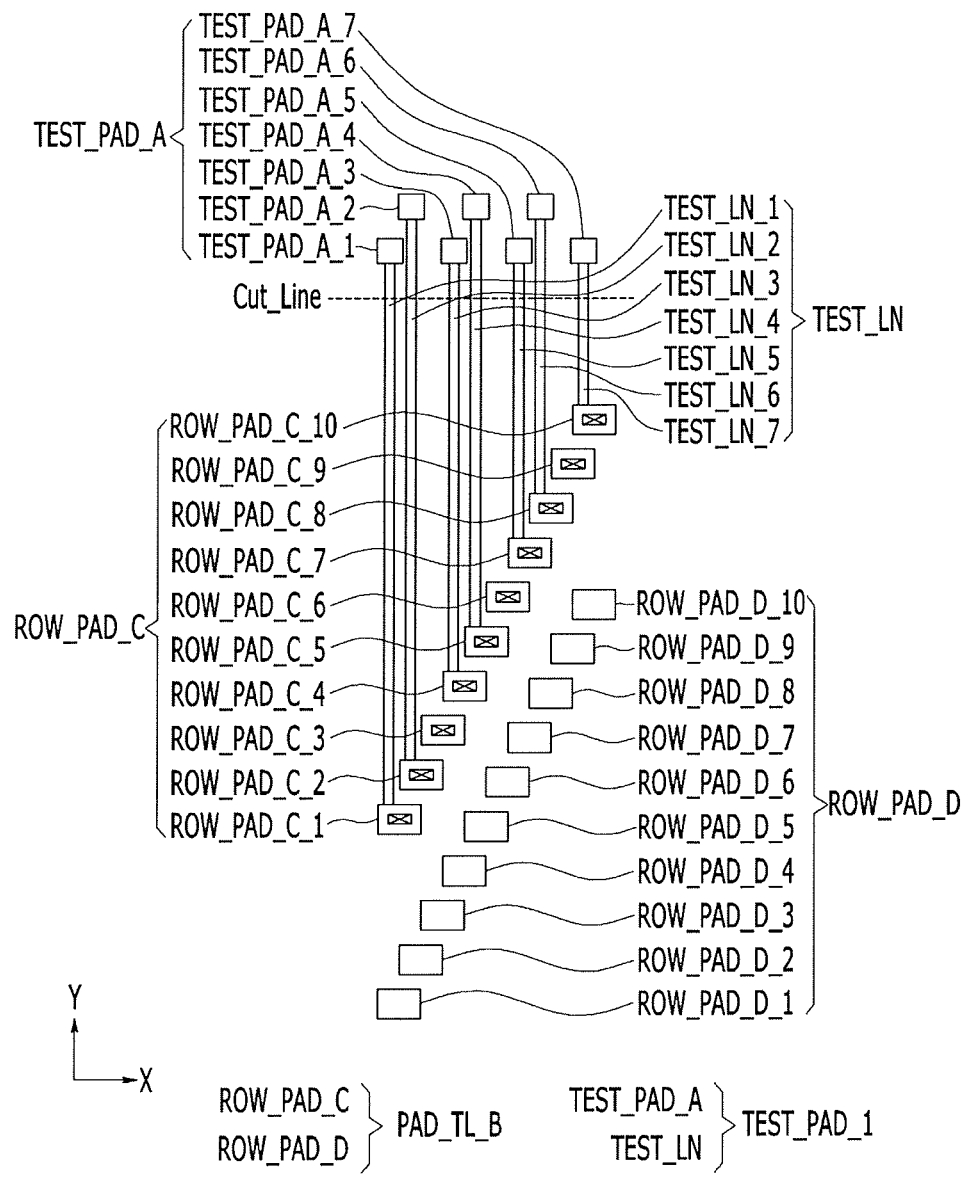
FIG. 12 is a plan view illustrating a variation of second pad terminals of FIG. 9, according to an exemplary embodiment of the present invention.
Figure 13:
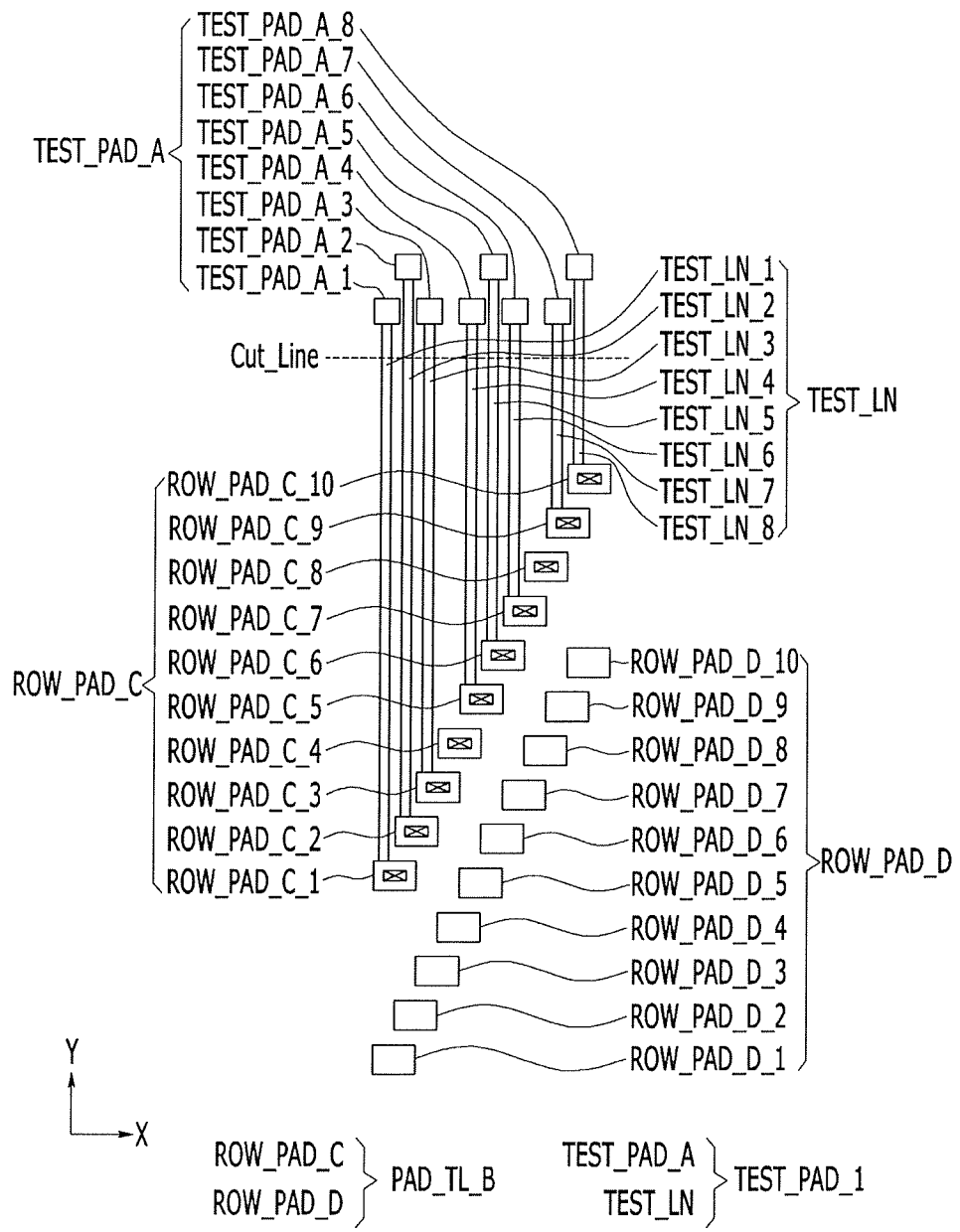
FIG. 13 is a plan view illustrating a variation of second pad terminals of FIG. 9, according to an exemplary embodiment of the present invention.
Figure 14:
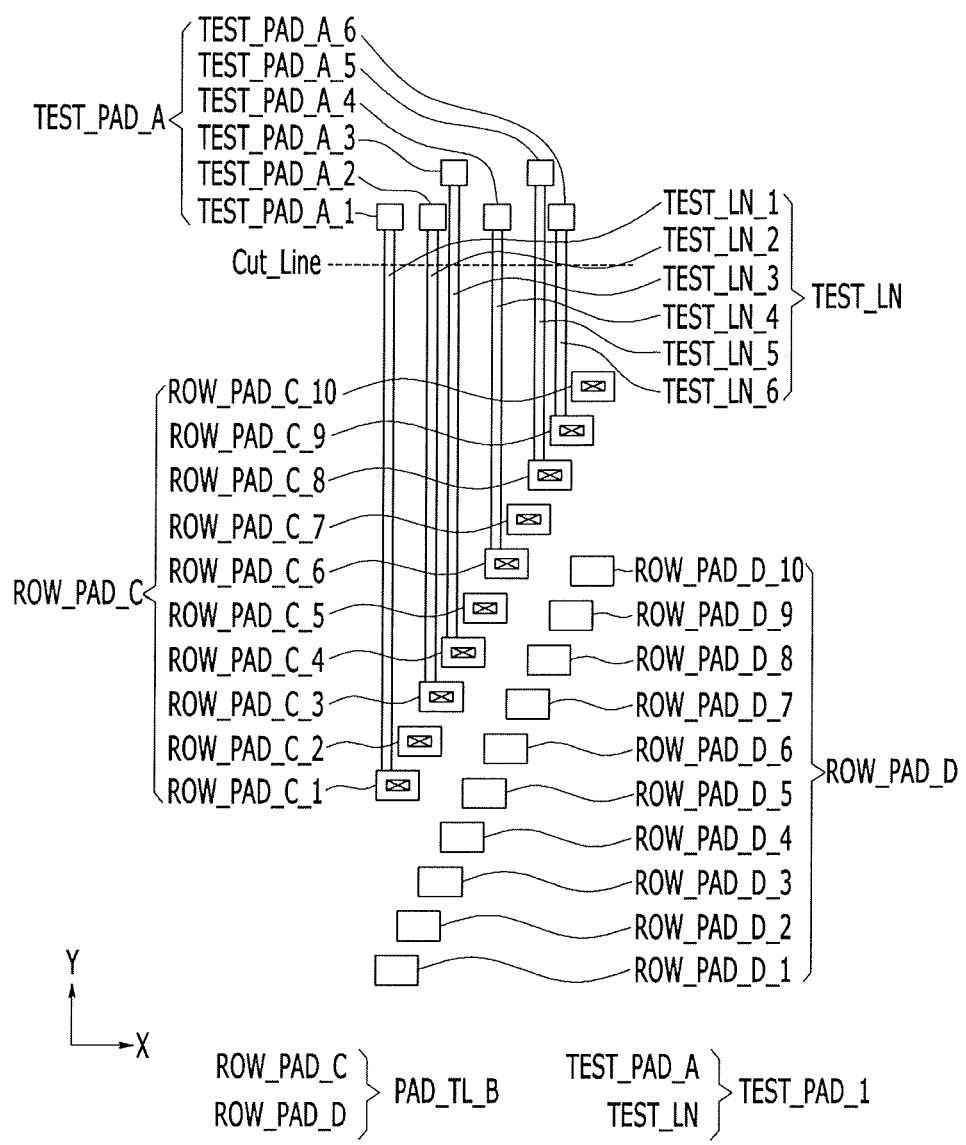
FIG. 14 is a plan view illustrating a variation of second pad terminals of FIG. 9, according to an exemplary embodiment of the present invention.

FIG. 12 is a plan view illustrating a variation of second pad terminals of FIG. 9, according to an exemplary embodiment of the present invention. FIG. 13 is a plan view illustrating a variation of second pad terminals of FIG. 9, according to an exemplary embodiment of the present invention. FIG. 14 is a plan view illustrating a variation of second pad terminals of FIG. 9, according to an exemplary embodiment of the present invention.

For example, as shown in FIG. 12, third-row sub-pad terminals (ROW_PAD_C_4, ROW_PAD_C_5, ROW_PAD_C_7, and ROW_PAD_C_8), to which two first test lines (TEST_LN) are connected, may be disposed among the third-row sub-pad terminals (ROW_PAD_C_3, ROW_PAD_C_6, and ROW_PAD_C_9), to which the first test line (TEST_LN) is not connected.

Third-row sub-pad terminals (ROW_PAD_C_4 and ROW_PAD_C_5), to which two first test lines (TEST_LN) are connected, may be disposed between the third-row sub-pad terminals (ROW_PAD_C_3 and ROW_PAD_C_6), to which the first test line (TEST_LN) is not connected. Further, third-row sub-pad terminals (ROW_PAD_C_7 and ROW_PAD_C_8), to which two first test lines (TEST_LN) are connected, may be disposed between the third-row sub-pad terminals (ROW_PAD_C_6 and ROW_PAD_C_9), to which the first test line (TEST_LN) is not connected.

For example, two third-row sub-pad terminals, to which the first test line (TEST_LN) is connected, may be consecutively disposed, and a third-row sub-pad terminal, to which one first test line (TEST_LN) is not connected, may be regularly arranged.

In addition, as shown in FIG. 13, third-row sub-pad terminals (ROW_PAD_C_5, ROW_PAD_C_6, and ROW_PAD_C_7), to which three first test lines (TEST_LN) are connected, may be disposed between the third-row sub-pad terminals (ROW_PAD_C_4 and ROW_PAD_C_8) to which the first test line (TEST_LN) is not connected.

For example, three third-row sub-pad terminals, to which the first test line (TEST_LN) is connected, may be consecutively disposed, and a third-row sub-pad terminal, to which one first test line (TEST_LN) is not connected, may be regularly disposed.

As shown in FIG. 14, the third-row sub-pad terminals to which the first test line (TEST_LN) is connected and the third-row sub-pad terminals to which the first test line (TEST_LN) is not connected may be irregularly arranged. For example, the third-row sub-pad terminal, to which the first test line (TEST_LN) is not connected, may be irregularly arranged among the third-row sub-pad terminals, to which the first test line (TEST_LN) is connected.

The first test line (TEST_LN) may extend in the upper-side direction, along the second direction (Y axis).

The first test pad terminal (TEST_PAD_A) may be disposed above the first test line (TEST_LN). For example, a first test pad terminal (TEST_PAD_A_1) may be disposed above the first test line (TEST_LN_1), a first test pad terminal (TEST_PAD_A_2) may be disposed above the first test line (TEST_LN_2), and a first test pad terminal (TEST_PAD_A_3) may be disposed above the first test line (TEST_LN_3). A first test pad terminal (TEST_PAD_A_4) may be disposed above the first test line (TEST_LN_4), and a first test pad terminal (TEST_PAD_A_5) may be disposed above the first test line (TEST_LN_5).

As shown in FIG. 11, before the printed circuit board (PCB) 300 is attached to the display substrate (SUB), a probe (PB) is used to test the printed circuit board (PCB) 300. In an exemplary embodiment of the present invention, the test is performed by allowing the probe (PB) to contact the first test pad terminal (TEST_PAD_A) and the third-row sub-pad terminals (ROW_PAD_C_2, ROW_PAD_C_4, ROW_PAD_C_6, ROW_PAD_C_8, and ROW_PAD_C_10), to which the first test line (TEST_LN) is not connected.

When the first test pad terminal (TEST_PAD_A) is connected to the third-row sub-pad terminals (ROW_PAD_C) through the first test line (TEST_LN), the test may be performed by contacting the probe (PB) with the first test pad terminal (TEST_PAD_A). However, in this case, the number of first test pad terminals (TEST_PAD_A) needed would be greater than that shown in FIG. 9, 10 or 11, (for example, the number of first test pad terminals (TEST_PAD_A) would be equal to that of the third-row sub-pad terminals (ROW_PAD_C)). Accordingly, an area occupied by the first test pad terminal (TEST_PAD_A) would increase.

However, the test may be performed by contacting the probe (PB) to some of the third-row sub-pad terminals (ROW_PAD_C) without connecting the probe (PB) to the first test line (TEST_LN), and by contacting the probe (PB) to some of the third-row sub-pad terminals (ROW_PAD_C). For example, the test may be performed by contacting the probe (PB) with the third-row sub-pad terminals (ROW_PAD_C), which are not connected to the first test lines (TEST_LN), and by contacting the probe (PB) with first test pad terminal (TEST_PAD_A). In this case, the area occupied by the first test pad terminal (TEST_PAD_A) may be reduced. For contact with the probe (PB), sizes of the third-row sub-pad terminals (ROW_PAD_C) may be increased or intervals (e.g., pitches) among the third-row sub-pad terminals (ROW_PAD_C) may be increased. A large number of third-row sub-pad terminals (ROW_PAD_C) might not be arranged in a limited area.

Therefore, when the test is performed by contacting the probe (PB) with the first test pad terminal (TEST_PAD_A) and the third-row sub-pad terminals (ROW_PAD_C_2, ROW_PAD_C_4, ROW_PAD_C_6, ROW_PAD_C_8, and ROW_PAD_C_10), to which the first test line (TEST_LN) is not connected, the area occupied by the first test pad terminal (TEST_PAD_A) may be reduced, a large number of third-row sub-pad terminals (ROW_PAD_C) may be disposed in the limited area, or the interval among the third-row sub-pad terminals (ROW_PAD_C) may be increased for direct contact with the probe (PB).

However, as shown in FIG. 10, before the printed circuit board (PCB) 300 is attached to the display substrate (SUB), the first test pad terminal (TEST_PAD_A) is separated from the first test line (TEST_LN) with respect to a cutting line (Cut_Line). Therefore, the first test pad terminal (TEST_PAD_A) is not disposed on the printed circuit board (PCB) 300, attached to the display substrate (SUB). For example, as shown in FIG. 7, the first test line (TEST_LN) exists on the printed circuit board (PCB) 300.

A variation of the second pad terminals (PAD_TL_B) shown in FIG. 9 will now be described with reference to FIG. 15.

Figure 15:
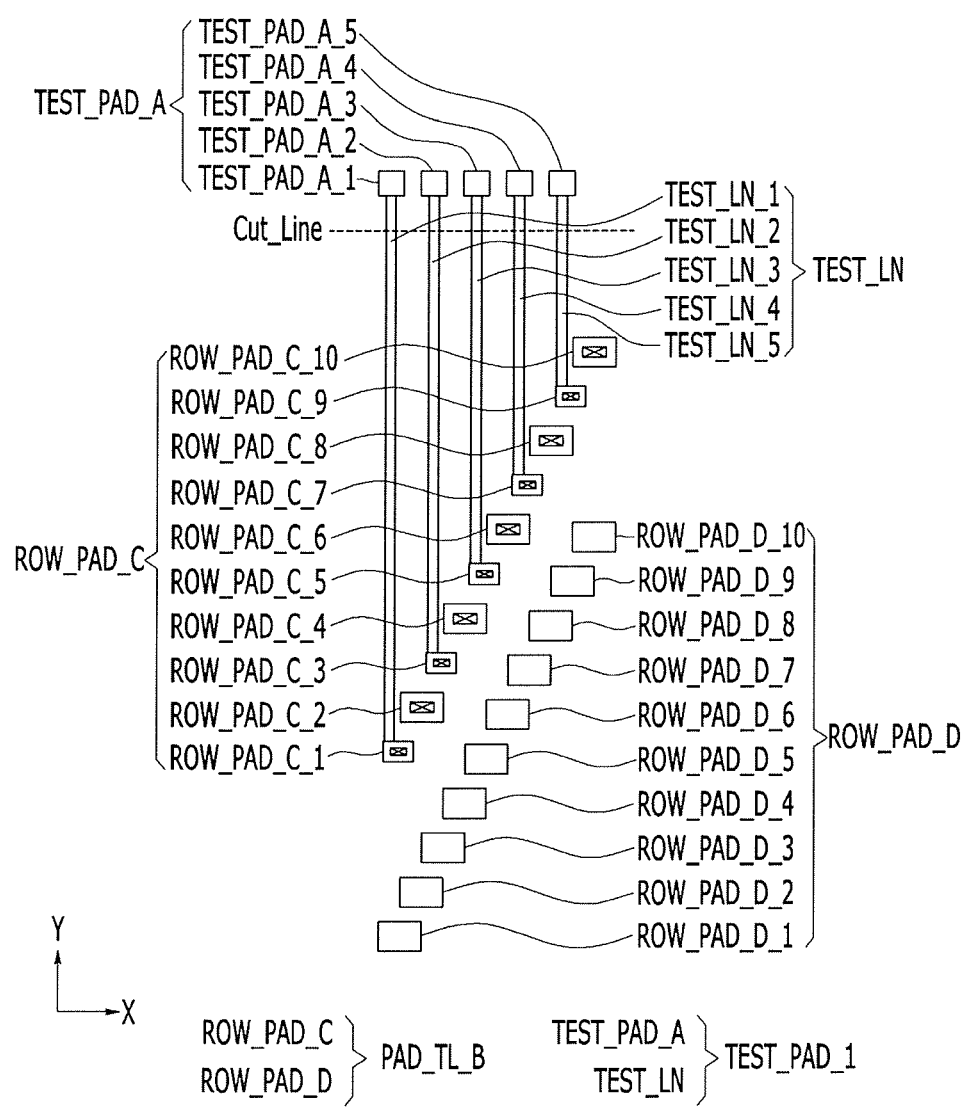
FIG. 15 is a plan view illustrating a variation of second pad terminals of FIG. 9, according to an exemplary embodiment of the present invention.

FIG. 15 is a plan view illustrating a variation of second pad terminals of FIG. 9, according to an exemplary embodiment of the present invention.

Referring to FIG. 15, the size of the third-row sub-pad terminals (ROW_PAD_C_2, ROW_PAD_C_4, ROW_PAD_C_6, ROW_PAD_C_8, and ROW_PAD_C_10), to which the first test line (TEST_LN) is not connected, may be different than the size of the third-row sub-pad terminals (ROW_PAD_C_1, ROW_PAD_C_3, ROW_PAD_C_5, ROW_PAD_C_7, and ROW_PAD_C_9), to which the first test line (TEST_LN) is connected. The sizes of the third-row sub-pad terminals ROW_PAD_C, as illustrated in FIG. 15, are indicative of the respective areas of the third-row sub-pad terminals ROW_PAD_C.

For example, the third-row sub-pad terminals (ROW_PAD_C_2, ROW_PAD_C_4, ROW_PAD_C_6, ROW_PAD_C_8, and ROW_PAD_C_10), to which the first test line (TEST_LN) is not connected, may be bigger than the third-row sub-pad terminals (ROW_PAD_C_1, ROW_PAD_C_3, ROW_PAD_C_5, ROW_PAD_C_7, and ROW_PAD_C_9), to which the first test line (TEST_LN) is connected.

As shown in FIG. 15, the third-row sub-pad terminals (ROW_PAD_C_1, ROW_PAD_C_3, ROW_PAD_C_5, ROW_PAD_C_7, and ROW_PAD_C_9) may be smaller than the third-row sub-pad terminals (ROW_PAD_C_1, ROW_PAD_C_3, ROW_PAD_C_5, ROW_PAD_C_7, and ROW_PAD_C_9) of FIG. 9. Therefore, in an exemplary embodiment of the present invention, the area that the third-row sub-pad terminals (ROW_PAD_C) occupy on the printed circuit board (PCB) 300 may be reduced.

In addition, when the third-row sub-pad terminals (ROW_PAD_C_1, ROW_PAD_C_3, ROW_PAD_C_5, ROW_PAD_C_7, and ROW_PAD_C_9) are made small and the third-row sub-pad terminals (ROW_PAD_C_2, ROW_PAD_C_4, ROW_PAD_C_6, ROW_PAD_C_8, and ROW_PAD_C_10) are made large, the probe (PB) may more easily contact the third-row sub-pad terminals that are not connected to the first test line (TEST_LN), e.g., the large the third-row sub-pad terminals (ROW_PAD_C_2, ROW_PAD_C_4, ROW_PAD_C_6, ROW_PAD_C_8, and ROW_PAD_C_10).

A combined state of first pad terminals (PAD_TL_A) and second pad terminals (PAD_TL_B) will be described with reference to FIG. 16 and FIG. 17.

Figure 16:
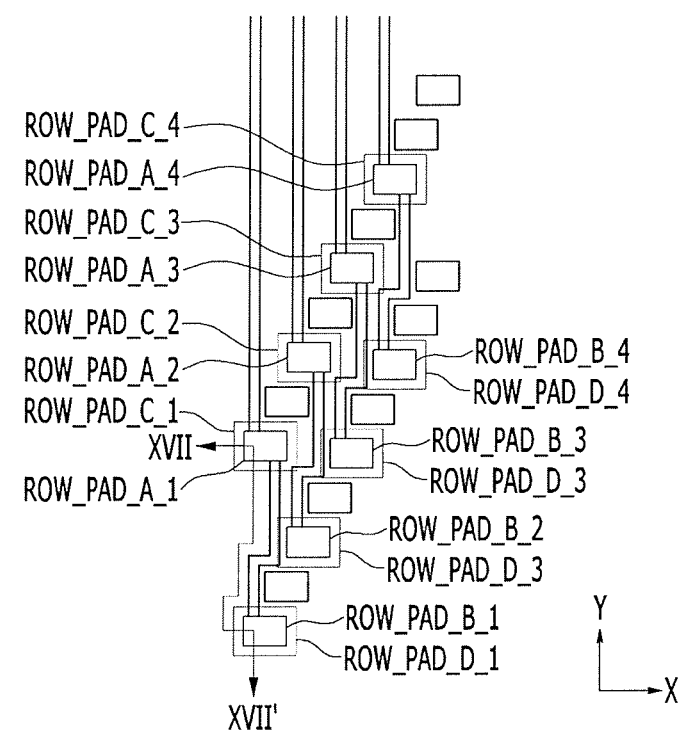
FIG. 16 is a plan view illustrating first pad terminals and second pad terminals electrically connected to each other, according to an exemplary embodiment of the present invention.
Figure 17:
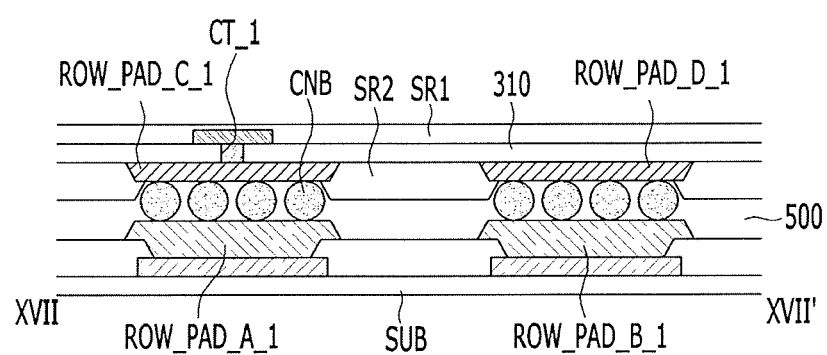
FIG. 17 is a cross-sectional view taken along line XVII-XVII' of FIG. 16, according to an exemplary embodiment of the present invention.

FIG. 16 is a plan view illustrating first pad terminals and second pad terminals electrically connected to each other, according to an exemplary embodiment of the present invention. FIG. 17 is a cross-sectional view taken along line XVII-XVII' of FIG. 16, according to an exemplary embodiment of the present invention.

The second pad terminals (PAD_TL_B, refer to FIG. 7) may be disposed above the first pad terminals (PAD_TL_A, refer to FIG. 5) to overlap the first pad terminals (PAD_TL_A). For example, the third-row sub-pad terminals (ROW_PAD_C) may be disposed above the first-row sub-pad terminals (ROW_PAD_A) to overlap the first-row sub-pad terminals (ROW_PAD_A). The fourth-row sub-pad terminals (ROW_PAD_D) may be disposed above the second-row sub-pad terminals (ROW_PAD_B) to overlap the second-row sub-pad terminals (ROW_PAD_B).

A conductive adhesive film 500 may be disposed between the first pad terminals (PAD_TL_A, refer to FIG. 5) and the second pad terminals (PAD_TL_B, refer to FIG. 7). The conductive adhesive film 500 may electrically connect the first-row sub-pad terminals (ROW_PAD_A) to the third-row sub-pad terminals (ROW_PAD_C). The first-row sub-pad terminals (ROW_PAD_A) may be electrically connected to the third-row sub-pad terminals (ROW_PAD_C) through a plurality of conductive balls (CNBs) included in the conductive adhesive film 500.

A printed circuit board (PCB) package, according to an exemplary embodiment of the present invention, will now be described with reference to FIG. 18 to FIG. 20. Elements described with reference to the printed circuit board (PCB) 300 may apply to the printed circuit board (PCB) package of FIG. 18 to FIG. 20.

Figure 18:
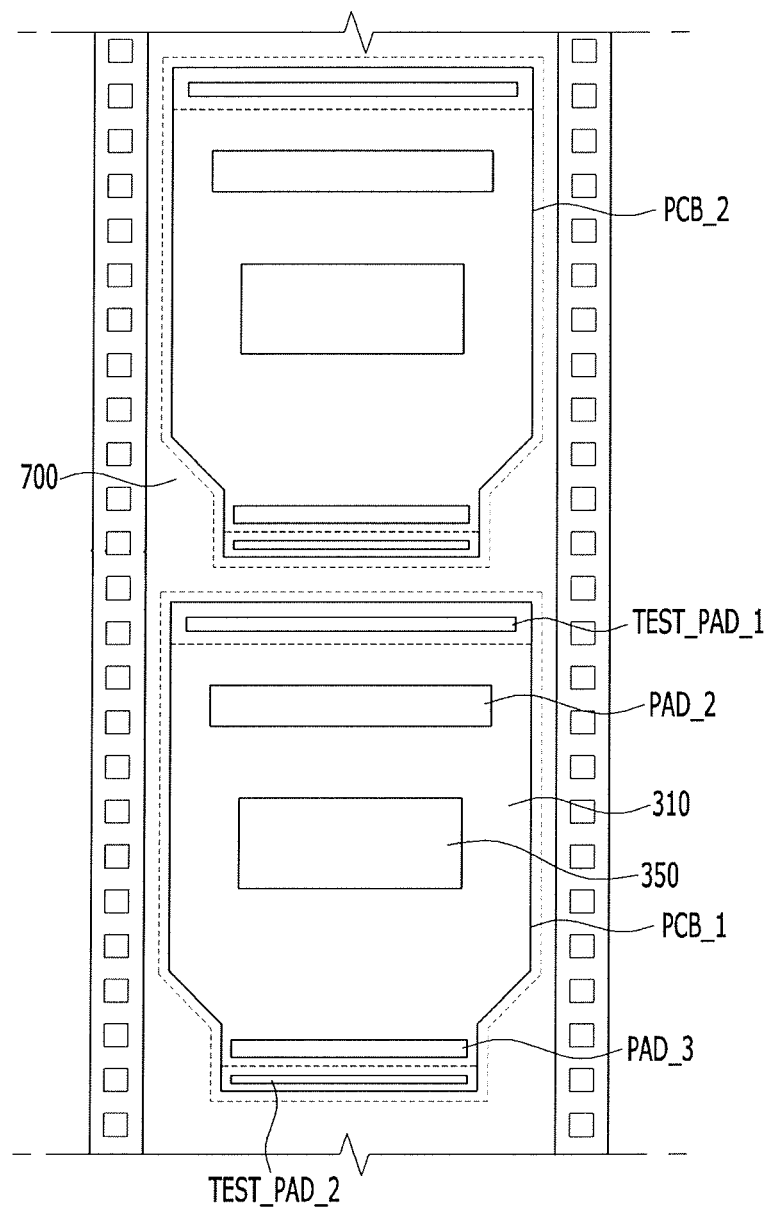
FIG. 18 is a plan view illustrating a state before a printed circuit board (PCB) package is separated into respective units, according to an exemplary embodiment of the present invention.

FIG. 18 is a plan view illustrating a state before a printed circuit board (PCB) package is separated into respective units, according to an exemplary embodiment of the present invention. FIG. 19 is a plan view of a printed circuit board (PCB) package according to an exemplary embodiment of the present invention. FIG. 20 is a plan view illustrating the printed circuit board (PCB) of FIG. 19 and a test pad portion in a separated state, according to an exemplary embodiment of the present invention.

Figure 19:
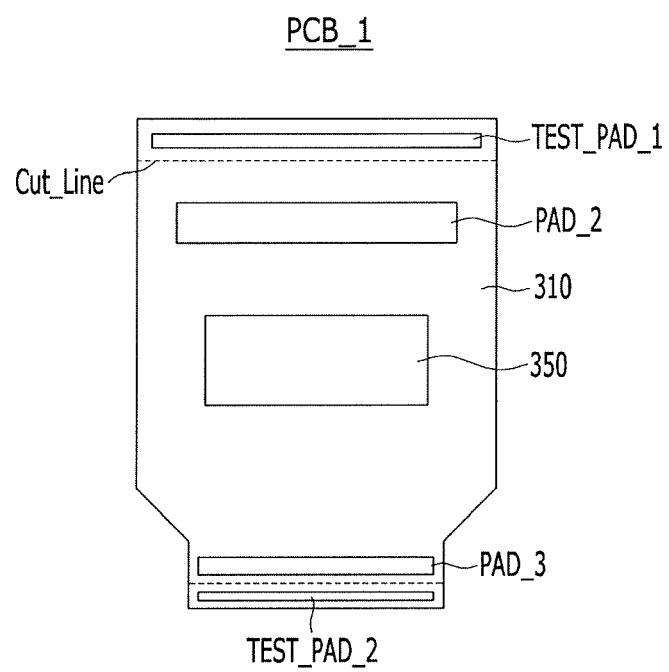
FIG. 19 is a plan view of a printed circuit board (PCB) package according to an exemplary embodiment of the present invention.
Figure 20:
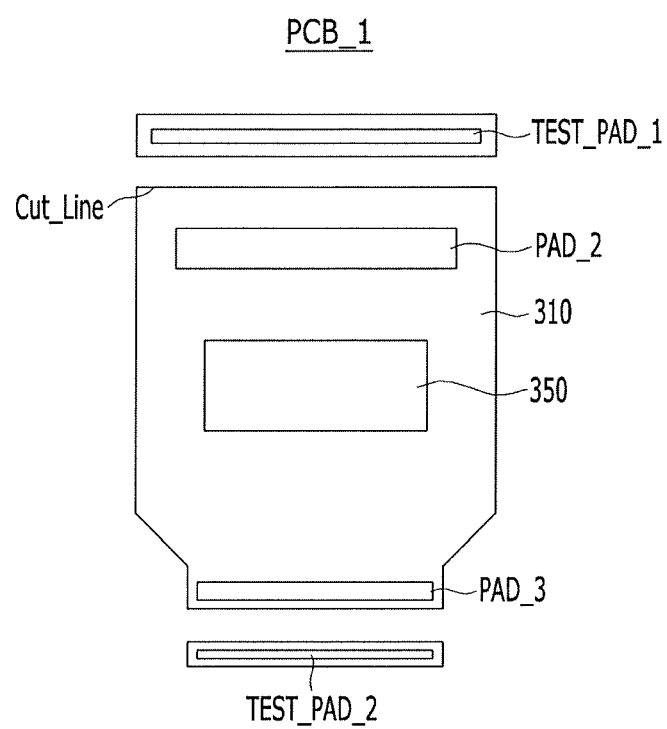
FIG. 20 is a plan view illustrating the printed circuit board (PCB) of FIG. 19 and a test pad portion in a separated state, according to an exemplary embodiment of the present invention.

Referring to FIG. 18 to FIG. 20, the printed circuit board (PCB) packages (PCB_1 and PCB_2) may include a base film 310, a second pad portion (PAD_2), a third pad portion (PAD_3), a first test pad portion (TEST_PAD_1), a second test pad portion (TEST_PAD_2), and a driving chip 350. The printed circuit board (PCB) packages (PCB_1 and PCB_2) show a state in which the first test pad portion (TEST_PAD_1) and the second test pad portion (TEST_PAD_2) are combined before they are attached to the display substrate (SUB).

Referring to FIG. 18, the printed circuit board (PCB) packages (PCB_1 and PCB_2) may be generated on a reel-type roll 700. When the roll 700 is incised along an outer side of the printed circuit board (PCB) packages (PCB_1 and PCB_2), the printed circuit board (PCB) packages (PCB_1 and PCB_2) may be acquired.

Referring to FIG. 19 and FIG. 20, regarding the printed circuit board (PCB) package (PCB_1), the second pad portion (PAD_2) and the first test pad portion (TEST_PAD_1) may be disposed on one side of the base film 310. The second pad portion (PAD_2) and the first test pad portion (TEST_PAD_1) correspond to the second pad portion (PAD_2) and the first test pad portion (TEST_PAD_1) shown in FIG. 9.

Referring to FIG. 9, a plurality of second pad terminals (PAD_TL_B) may be disposed on the second pad portion (PAD_2). The second pad terminals (PAD_TL_B) may respectively include third-row sub-pad terminals (ROW_PAD_C) and fourth-row sub-pad terminals (ROW_PAD_D).

The first test pad portion (TEST_PAD_1) may be disposed near the third-row sub-pad terminals (ROW_PAD_C). The first test pad portion (TEST_PAD_1) may include the first test pad terminal (TEST_PAD_A) and the first test line (TEST_LN).

The first test line (TEST_LN) may be connected to the third-row sub-pad terminals (ROW_PAD_C_1, ROW_PAD_C_3, ROW_PAD_C_5, ROW_PAD_C_7, and ROW_PAD_C_9), from among the third-row sub-pad terminals (ROW_PAD_C). The first test line (TEST_LN) is not connected to the other third-row sub-pad terminals (ROW_PAD_C_2, ROW_PAD_C_4, ROW_PAD_C_6, ROW_PAD_C_8, and ROW_PAD_C_10), from among the third-row sub-pad terminals (ROW_PAD_C).

The first test pad terminal (TEST_PAD_A) may be disposed on the first test line (TEST_LN).

The first test line (TEST_LN) may be connected to the third-row sub-pad terminals (ROW_PAD_C_1, ROW_PAD_C_3, ROW_PAD_C_5. ROW_PAD_C_7, and ROW_PAD_C_9), from among the third-row sub-pad terminals (ROW_PAD_C). The first test pad terminal (TEST_PAD_A) may be disposed on the first test line (TEST_LN). For example, in an exemplary embodiment of the present invention, the first test pad terminal (TEST_PAD_A) may be connected to the third-row sub-pad terminals (ROW_PAD_C_1, ROW_PAD_C_3, ROW_PAD_C_5, ROW_PAD_C_7, and ROW_PAD_C_9), from among the third-row sub-pad terminals (ROW_PAD_C).

As described, when the first test pad terminal (TEST_PAD_A), connected to the third-row sub-pad terminals (ROW_PAD_C_1, ROW_PAD_C_3, ROW_PAD_C_5, ROW_PAD_C_7, and ROW_PAD_C_9), is disposed on the first test pad portion (TEST_PAD_1), the area occupied by the first test pad terminal (TEST_PAD_A) may be reduced in the first test pad portion (TEST_PAD_1).

Further, in the second pad portion (PAD_2), the probe (PB) may be used to contact the third-row sub-pad terminals (ROW_PAD_C_2, ROW_PAD_C_4, ROW_PAD_C 6, ROW_PAD_C_8, and ROW_PAD_C_10) by reducing the size of the third-row sub-pad terminals (ROW_PAD_C_1, ROW_PAD_C_3, ROW_PAD_C_5, ROW_PAD_C_7, and ROW_PAD_C_9), to which the first test line (TEST_LN) is connected. In addition, the interval among the third-row sub-pad terminals (ROW_PAD_C_2, ROW_PAD_C_4, ROW_PAD_C_6, ROW_PAD_C_8, and ROW_PAD_C_10), to which the first test line (TEST_LN) is not connected, may be increased.

The configuration and connections of third pad portion (PAD_3) and the second test pad portion (TEST_PAD_2) may be similar to those described above with reference to the second pad portion (PAD_2) and first test pad portion (TEST_PAD_1). Hence, detailed descriptions on the third pad portion (PAD_3) and the second test pad portion (TEST_PAD_2) may be omitted for brevity.

In a display device, according to an exemplary embodiment of the present invention, the first test lines (TEST_LN) may be connected to some of a plurality of third-row sub-pad terminals (ROW_PAD_C) of the printed circuit board (PCB) 300.

While the present invention has been particularly shown and described with reference to exemplary embodiments thereof, it will be apparent to those of ordinary skill in the art that various changes in form and detail may be made therein without departing from the spirit and scope of the present invention.

What is claimed is:

1. A display device, comprising:
 a display substrate including a display area for displaying an image and a pad region disposed at a side of the display area;
 a first pad portion including a plurality of first pad terminals, the first pad portion being disposed in the pad region, the plurality of first pad terminals being arranged in a first direction; and
 a printed circuit board (PCB) including a base film and a second pad portion, wherein the second pad portion is disposed at a side of the base film and is electrically connected to the first pad portion, the second pad portion is disposed at a side of the base film and is electrically connected to the first pad portion,
 wherein the second pad portion includes:
  a plurality of second pad terminals electrically connected to the plurality of first pad terminals; and
  a plurality of first test lines,
  wherein the plurality of second pad terminals includes a plurality of sub-pad terminals,
  wherein one of the plurality of first test lines is connected to a first sub-pad terminal of the plurality of sub-pad terminals, and a second sub-pad terminal of the plurality of sub-pad terminals is not connected to any of the plurality of first test lines, and
  wherein each of the plurality of first test lines extends toward an end portion of the base film.

2. The display device of claim 1, wherein the plurality of first pad terminals includes:
 a plurality of first-row sub-pad terminals arranged along a first virtual line which forms a first inclination angle with respect to the first direction, wherein a pair of the plurality of first-row sub-pad terminals extend in parallel to each other;
 a plurality of second-row sub-pad terminals separated from the plurality of first-row sub-pad terminals, wherein the plurality of second-row sub-pad terminals is arranged along a second virtual line which forms a second inclination angle with respect to the first direction, wherein a pair of second-row sub-pad terminals of the plurality of second-row sub-pad terminals extend parallel to each other; and
 each of a plurality of first terminal connecting lines electrically connects one of the plurality of first-row sub-pad terminals to one of the plurality of second-row sub-pad terminals, wherein at least one of the plurality of first terminal connecting lines has at least one bend along its length.

3. The display device of claim 2, wherein the first inclination angle is substantially equal to the second inclination angle.

4. The display device of claim 3, wherein each of the first inclination angle and the second inclination angle is greater than 0 degrees and less than 90 degrees.

5. The display device of claim 2, wherein at least one first dummy pad terminal, from among the plurality of first-row sub-pad terminals, is disposed between a pair of adjacent first-row sub-pad terminals.

6. The display device of claim 5, wherein one of the plurality of first-row sub-pad terminals and the at least one first dummy pad terminal extend parallel to each other.

7. The display device of claim 2, wherein at least one second dummy pad terminal, from among the plurality of second-row sub-pad terminals, is disposed between a pair of adjacent second-row sub-pad terminals.

8. The display device of claim 7, wherein the pair of adjacent second-row sub-pad terminals and the at least one second dummy pad terminal extend parallel to each other.

9. The display device of claim 2, wherein the plurality of sub-pad terminals include:
- a plurality of third-row sub-pad terminals arranged along the first virtual line which forms the first inclination angle with respect to the first direction, wherein a pair of the plurality of third-row sub-pad terminals extend parallel to each other; and
- a plurality of fourth-row sub-pad terminals separated from the plurality of third-row sub-pad terminals, wherein the plurality of fourth-row sub-pad terminals is arranged along the second virtual line which forms the second inclination angle with respect to the first direction, wherein a pair of the plurality of fourth-row sub-pad terminals extend parallel to each other.

10. The display device of claim 9, wherein the plurality of first-row sub-pad terminals overlaps the plurality of third-row sub-pad terminals, and
the plurality of second-row sub-pad terminals overlaps the plurality of fourth-row sub-pad terminals.

11. The display device of claim 9, wherein one of the plurality of first test lines is connected to a first third-row sub-pad terminal of the plurality of third-row sub-pad terminals, and a second third-row sub-pad terminal of the plurality of third-row sub-pad terminals is not connected to any of the plurality of first test lines.

12. The display device of claim 11, wherein the first third-row sub-pad terminal of the plurality of third-row sub-pad terminals is disposed between a pair of the second third-row sub-pad terminal of the plurality of third-row sub-pad terminals.

13. The display device of claim 11, wherein a size of the second third-row sub-pad terminal of the plurality of third-row sub-pad terminals is different from a size of the first third-row sub-pad terminal of the plurality of third-row sub-pad terminals.

14. The display device of claim 13, wherein the second third-row sub-pad terminal of the plurality of third-row sub-pad terminals is bigger than the first third-row sub-pad terminal of the plurality of third-row sub-pad terminals.

15. The display device of claim 9, wherein the PCB further includes a first terminal wire disposed on a first surface of the base film, which is opposite to second surface of the base film, on which the plurality of third-row sub-pad terminals are disposed,
wherein the first terminal wire is electrically connected to the plurality of third-row sub-pad terminals through a first contact hole, the first contact hole penetrating the base film, and
wherein the first contact hole overlaps the plurality of third-row sub-pad terminals.

16. The display device of claim 1, wherein the plurality of first test lines extend in a second direction crossing the first direction.

17. The display device of claim 1, wherein the PCB further includes a driving chip disposed on the base film.

18. The display device of claim 1, wherein the base film is flexible.

* * * * *